United States Patent
Ota et al.

(10) Patent No.: US 8,901,014 B2
(45) Date of Patent: Dec. 2, 2014

(54) METHOD OF MANUFACTURING SEMICONDUCTOR DEVICE, SUBSTRATE PROCESSING METHOD, SUBSTRATE PROCESSING APPARATUS AND NON-TRANSITORY COMPUTER READABLE RECORDING MEDIUM

(75) Inventors: Yosuke Ota, Toyama (JP); Naonori Akae, Toyama (JP); Yoshiro Hirose, Toyama (JP); Ryota Sasajima, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 15 days.

(21) Appl. No.: 13/618,112

(22) Filed: Sep. 14, 2012

(65) Prior Publication Data

US 2013/0072027 A1 Mar. 21, 2013

(30) Foreign Application Priority Data

Sep. 16, 2011 (JP) ................................ 2011-203799
Jul. 26, 2012 (JP) ................................ 2012-166405

(51) Int. Cl.
- H01L 21/31 (2006.01)
- C23C 16/455 (2006.01)
- H01L 21/02 (2006.01)

(52) U.S. Cl.
CPC ...... *C23C 16/45542* (2013.01); *H01L 21/0214* (2013.01); *H01L 21/02164* (2013.01); *H01L 21/0217* (2013.01); *H01L 21/022* (2013.01); *H01L 21/02211* (2013.01); *H01L 21/02274* (2013.01); *H01L 21/0228* (2013.01); *C23C 16/45529* (2013.01); *C23C 16/45546* (2013.01)
USPC .................................. 438/763; 257/E21.282

(58) Field of Classification Search
USPC .................................................. 438/763, 786
See application file for complete search history.

(56) References Cited

U.S. PATENT DOCUMENTS

| 6,117,777 | A * | 9/2000 | Zhou et al. ................ 438/692 |
| 6,780,708 | B1 * | 8/2004 | Kinoshita et al. ........... 438/241 |
| 7,410,913 | B2 * | 8/2008 | Lee et al. ................... 438/778 |
| 7,884,034 | B2 | 2/2011 | Hirose et al. | |

(Continued)

FOREIGN PATENT DOCUMENTS

| JP | A-2000-100809 | 4/2000 |
| JP | A-2006-190787 | 7/2006 |

(Continued)

OTHER PUBLICATIONS

Oct. 16, 2013 Notice of Reasons for Rejection issued in Korean Patent Application No. 10-2012-0101365 (with English-language translation).

*Primary Examiner* — Reema Patel
(74) *Attorney, Agent, or Firm* — Oliff PLC

(57) ABSTRACT

Provided is a method of manufacturing a semiconductor device having a structure in which an oxide film and a nitride film are stacked. The method includes forming a stacked film having an oxide film and a nitride film stacked therein on a substrate in a processing container by alternately performing a first cycle and a second cycle a predetermined number of times, the first cycle comprising forming the oxide film by supplying a source gas, a nitriding gas and an oxidizing gas to the substrate in the processing container a predetermined number of times, and the second cycle comprising forming the nitride film by supplying the source gas and the nitriding gas to the substrate in the processing container a predetermined number of times, wherein the forming of the oxide film and the forming of the nitride film are consecutively performed while retaining a temperature of the substrate constant.

14 Claims, 15 Drawing Sheets

(56) References Cited

U.S. PATENT DOCUMENTS

| | | |
|---|---|---|
| 2003/0228770 A1* | 12/2003 | Lee et al. .................... 438/791 |
| 2006/0178019 A1* | 8/2006 | Senzaki et al. ............... 438/788 |
| 2008/0166886 A1* | 7/2008 | Sakai et al. .................. 438/778 |
| 2009/0170345 A1 | 7/2009 | Akae et al. |
| 2010/0105192 A1 | 4/2010 | Akae et al. |

FOREIGN PATENT DOCUMENTS

| | | |
|---|---|---|
| JP | A-2010-050425 | 3/2010 |
| JP | A-2010-062230 | 3/2010 |
| JP | A-2010-153776 | 7/2010 |
| JP | A-2010-268007 | 11/2010 |

* cited by examiner

METHOD OF MANUFACTURING SEMICONDUCTOR DEVICE, SUBSTRATE PROCESSING METHOD, SUBSTRATE PROCESSING APPARATUS AND NON-TRANSITORY COMPUTER READABLE RECORDING MEDIUM

CROSS-REFERENCE TO RELATED PATENT APPLICATION

This application claims priority to and the benefit of Japanese Patent Application No. 2011-203799 filed on Sep. 16, 2011, and Japanese Patent Application No. 2012-166405 filed on Jul. 26, 2012, the disclosures of which are incorporated herein by reference.

BACKGROUND OF THE INVENTION

1. Field of the Invention

The present invention relates to a method of manufacturing a semiconductor device including forming a thin film on a substrate, a method of processing a substrate, a substrate processing apparatus that is preferably used in forming the thin film on the substrate, and a non-transitory computer readable recording medium.

2. Description of the Related Art

As one process of a method of manufacturing a semiconductor device, a process of forming an insulating film having an ONO stacked structure, in which oxide films and nitride films are alternately stacked on a substrate, may be carried out. In this case, characteristics of the semiconductor device may vary according to an electrical film thickness of the insulating film having the ONO stacked structure. Since such a variation causes a deviation in operation of the semiconductor device, the oxide films and the nitride films, both of which constitute the insulating film having the ONO stacked structure, require high uniformity in film thickness.

As the oxide film constituting the insulating film having the ONO stacked structure, for example, a silicon oxide film (an SiO film) obtained by reaction silane ($SiH_4$) gas and nitric oxide ($N_2O$) gas, that is, a high-temperature oxide (HTO) film, or a silicon oxide film (an SiO film) obtained by reaction of TEOS [$Si(OC_2H_5)_4$] gas and oxygen ($O_2$) gas, that is, a TEOS film is used. Also, a silicon nitride film (an SiN film) obtained, for example, by reaction of dichlorosilane ($SiH_2Cl_2$) gas and ammonia ($NH_3$) gas is used as the nitride film.

In the related art, these films were formed by a method such as so-called low pressure-chemical vapor deposition (LP-CVD). However, when the oxide film or the nitride film is formed using the conventional LP-CVD method, a deviation in film thickness, for example, a deviation of 2% to 4%, may be caused.

Also, in the conventional LP-CVD method, since film formation temperatures of the oxide film and the nitride film are different, temperature adjustment should be performed between these film formation processes when continuous film formation is performed. Therefore, the advantages of continuous film formation of these films using the same apparatus are insufficient. As a result, in the related art, these films were discontinuously formed in different temperature ranges using different apparatuses. In this case, however, the productivity may be significantly lowered since additional processes such as transferring of a substrate between the different apparatuses and pressure regulation after the transferring should be newly performed in addition to the temperature adjustment between the film formation processes, that is, an increase/decrease in temperature of the substrate.

SUMMARY OF THE INVENTION

The present invention provides a method of manufacturing a semiconductor device capable of improving the uniformity in film thickness of an insulating film having a structure in which oxide films and nitride films are stacked, and thus enhancing the productivity during film formation, a method of processing a substrate, a substrate processing apparatus and a non-transitory computer readable recording medium.

According to one embodiment of the present invention, there is provided a method of manufacturing a semiconductor device, including:

forming a stacked film having an oxide film and a nitride film stacked therein on a substrate in a processing container by alternately performing a first cycle and a second cycle a predetermined number of times, the first cycle including forming the oxide film by supplying a source gas, a nitriding gas and an oxidizing gas to the substrate in the processing container a predetermined number of times, and the second cycle including forming the nitride film by supplying the source gas and the nitriding gas to the substrate in the processing container a predetermined number of times, wherein the forming of the oxide film and the forming of the nitride film are consecutively performed while retaining a temperature of the substrate constant.

According to another embodiment of the present invention, there is provided a method of manufacturing a semiconductor device, including:

forming a stacked film having an oxide film and a nitride film stacked therein on a substrate in a processing container by alternately performing a first cycle and a second cycle a predetermined number of times, the first cycle including forming the oxide film on the substrate by supplying a source gas, an oxidizing gas and a reducing gas a predetermined number of times, and the second cycle including forming the nitride film on the substrate by supplying the source gas and a nitriding gas a predetermined number of times, wherein the forming of the oxide film and the forming of the nitride film are consecutively performed while retaining a temperature of the substrate constant.

According to still another embodiment of the present invention, there is provided a method of manufacturing a semiconductor device, including:

forming a stacked film having an oxide film, a nitride film and a oxynitride film stacked therein on a substrate in a processing container by alternately performing a first cycle, a second cycle and a third cycle a predetermined number of times, the first cycle including forming the oxide film by supplying a source gas, a nitriding gas and an oxidizing gas to the substrate in the processing container a predetermined number of times, the second cycle including forming the nitride film by supplying the source gas and the nitriding gas to the substrate in the processing container a predetermined number of times, and the third cycle including forming the oxynitride film by supplying the source gas, the nitriding gas and the oxidizing gas a predetermined number of times, wherein the forming of the oxide film, the forming of the nitride film and the forming of the oxynitride film are consecutively performed while retaining a temperature of the substrate constant.

According to still another embodiment of the present invention, there is provided a method of processing a substrate, including:

forming a stacked film having an oxide film and a nitride film stacked therein on a substrate in a processing container by alternately performing a first cycle and a second cycle a predetermined number of times, the first cycle including forming the oxide film by supplying a source gas, a nitriding gas and an oxidizing gas to the substrate in the processing container a predetermined number of times, and the second cycle including forming the nitride film by supplying the source gas and the nitriding gas to the substrate in the processing container a predetermined number of times, wherein the forming of the oxide film and the forming of the nitride film are consecutively performed while retaining a temperature of the substrate constant.

According to still another embodiment of the present invention, there is provided a substrate processing apparatus including:

a processing container configured to accommodate a substrate;

a heater configured to heat the substrate in the processing container;

a source gas supply system configured to supply a source gas to the substrate in the processing container;

a nitriding gas supply system configured to supply a nitriding gas to the substrate in the processing container;

an oxidizing gas supply system configured to supply an oxidizing gas to the substrate in the processing container; and a control unit configured to control the heater, the source gas supply system, the nitriding gas supply system and the oxidizing gas supply system so as to form a stacked film having an oxide film and a nitride film stacked therein on the substrate in the processing container by alternately performing a first cycle and a second cycle a predetermined number of times, the first cycle including forming the oxide film by supplying the source gas, the nitriding gas and the oxidizing gas to the substrate in the processing container a predetermined number of times, and the second cycle including forming the nitride film by supplying the source gas and the nitriding gas to the substrate in the processing container a predetermined number of times, wherein the forming of the oxide film and the forming of the nitride film are consecutively performed while retaining a temperature of the substrate constant.

According to yet another embodiment of the present invention, there is provided a non-transitory computer-readable recording medium storing a program causing a computer to perform a process, the process including:

forming a stacked film having an oxide film and a nitride film stacked therein on a substrate in a processing container by alternately performing a first cycle and a second cycle a predetermined number of times, the first cycle including forming the oxide film by supplying a source gas, a nitriding gas and an oxidizing gas to the substrate in the processing container a predetermined number of times, and the second cycle including forming the nitride film by supplying the source gas and the nitriding gas to the substrate in the processing container a predetermined number of times, wherein the forming of the oxide film and the forming of the nitride film are consecutively performed while retaining a temperature of the substrate constant.

DETAILED DESCRIPTION OF THE PREFERRED EMBODIMENTS

<First Embodiment of the Present Invention>

Hereinafter, the first embodiment of the present invention will be described with reference the drawings.

(1) Configuration of Substrate Processing Apparatus

Figure 1:
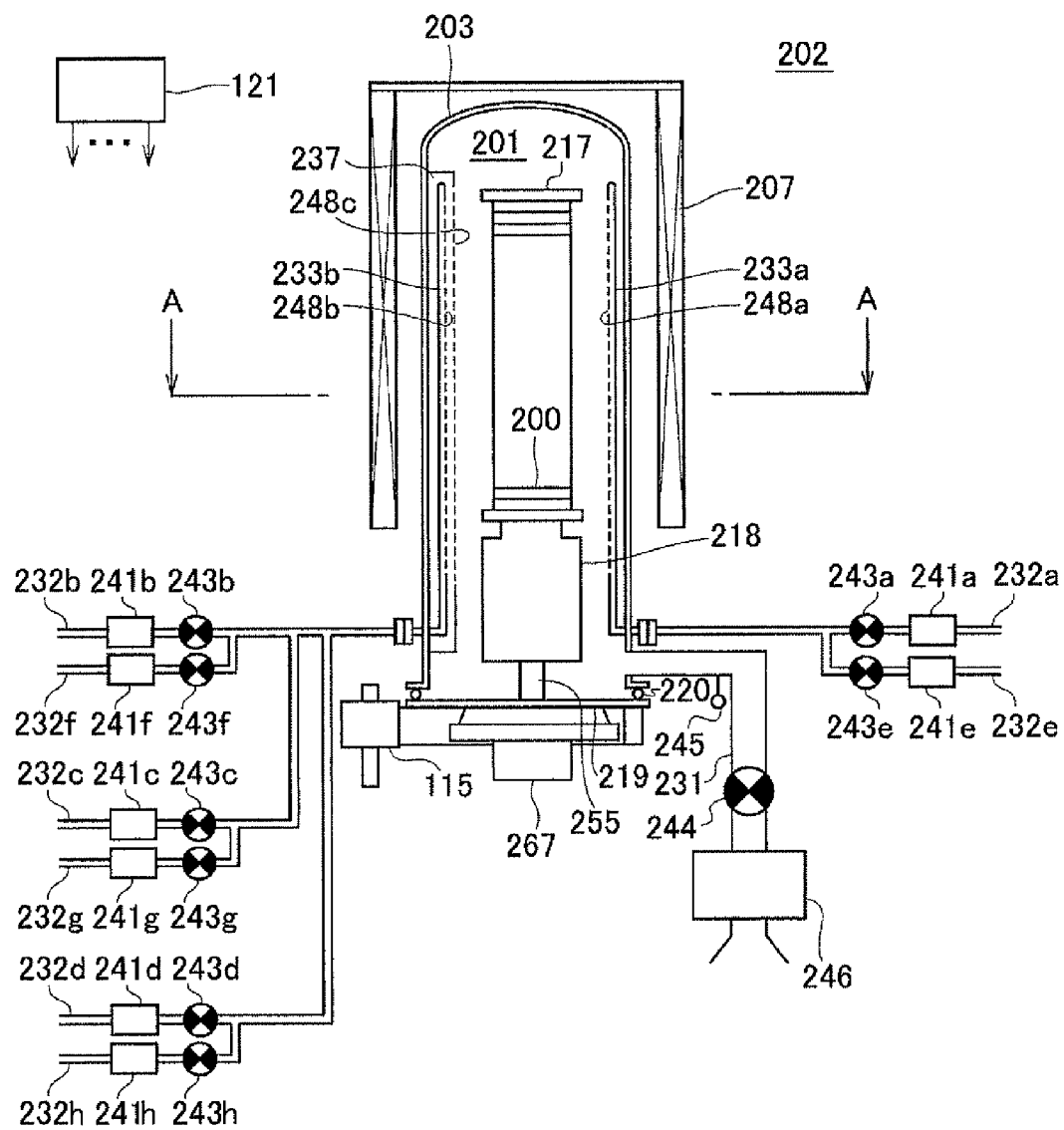
FIG. 1 is a schematic configuration diagram of a vertical processing furnace of a substrate processing apparatus which is preferably used in one embodiment of the present invention, showing a vertical cross-sectional view of a portion of the processing furnace.
Figure 2:
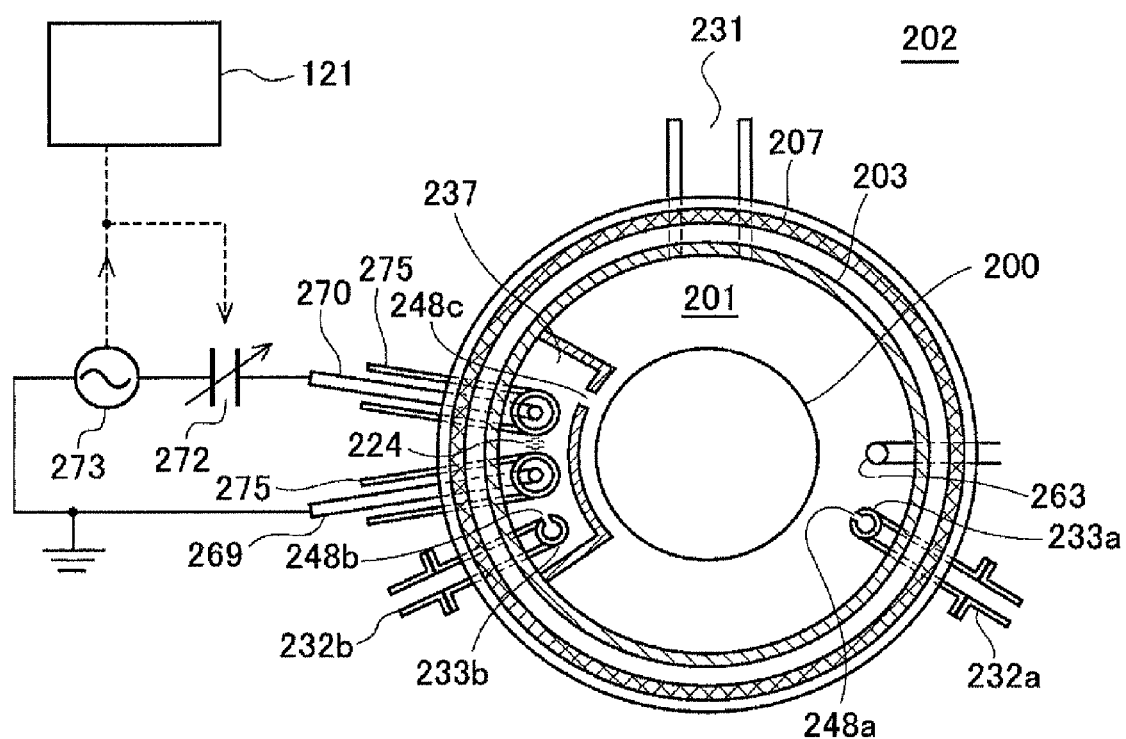
FIG. 2 is a schematic configuration diagram of the vertical processing furnace of the substrate processing apparatus which is preferably used in one embodiment of the present invention, showing a cross-sectional view taken along line A-A in the portion of the processing furnace shown in FIG. 1.

FIG. 1 is a schematic configuration diagram of a vertical processing furnace of a substrate processing apparatus which is preferably used in this embodiment, showing a vertical cross-sectional view of a portion of the processing furnace 202. Also, FIG. 2 is a schematic configuration diagram of the vertical processing furnace of the substrate processing apparatus which is preferably used in this embodiment, showing a cross-sectional view taken along line A-A in the portion of the processing furnace 202 shown in FIG. 1. In addition, the present invention is not limited to the substrate processing apparatus according to this embodiment, and is preferably applicable to a substrate processing apparatus including a single-type, hot wall-type, or cold wall-type processing furnace.

As shown in FIG. 1, the processing furnace 202 includes a heater 207 serving as a heating unit (a heating mechanism). The heater 207 has a cylindrical shape, and is supported by a heater base (not shown) serving as a retaining plate to be vertically installed. Also, the heater 207 functions as an activation mechanism configured to activate a gas with heat, as will be described below.

A reaction tube 203 constituting a processing container (processing container) in a concentric shape with respect to the heater 207 is arranged inside the heater 207. For example, the reaction tube 203 is made of a heat-resistant material such as quartz ($SiO_2$) or silicon carbide (SiC), and is formed in a cylindrical shape with an upper end closed and a lower end open. A process chamber 201 is formed at a hollow tubular portion of the reaction tube 203, and a wafer 200 serving as a substrate is configured to be accommodated in a horizontal posture by means of a boat 217, as will be described below, in a state in which the wafers 200 are arranged in multiple stages in a vertical direction.

A first nozzle 233a serving as a first gas introduction port and a second nozzle 233b serving as a second gas introduction port are installed inside the process chamber 201 to pass through a lower sidewall of the reaction tube 203. A first gas supply pipe 232a is connected to the first nozzle 233a. Also a second gas supply pipe 232b, a third gas supply pipe 232c and a fourth gas supply pipe 232d are connected to the second nozzle 233b. As described above, two nozzles 233a and 233b and four gas supply pipes 232a, 232b, 232c and 232d are installed at the reaction tube 203, and may be configured to supply plural (for example, 4) kinds of gases into the processing chamber 201.

Also, a manifold that is made of a metal and configured to support the reaction tube 203 may be installed at a lower portion of the reaction tube 203, and each nozzle may be installed to pass through the sidewall of the manifold made of the metal. In this case, an exhaust pipe 231 as will be described below may be installed at the manifold made of the metal. In this case, the exhaust pipe 231 may also be installed in the lower portion of the reaction tube 203 rather than the manifold made of the metal. When a furnace port portion of the processing furnace 202 is made of a metal as described above, a nozzle may be installed at the furnace port portion made of the metal.

A mass flow controller (MFC) 241a that is a flow rate control device (a flow rate control unit) and a valve 243a serving as an opening/closing valve are installed at the first gas supply pipe 232a sequentially from an upstream side thereof. Also, a first inert gas supply pipe 232e is connected to the first gas supply pipe 232a at a downstream side of the valve 243a. A mass flow controller 241e that is a flow rate control device (a flow rate control unit) and a valve 243e serving as an opening/closing valve are installed at the first inert gas supply pipe 232e sequentially from an upstream side thereof. Also, the above-described first nozzle 233a is connected to a leading end of the first gas supply pipe 232a. The first nozzle 233a is installed in an arc-shaped space between an inner wall of the reaction tube 203 and the wafer 200 so that the first nozzle 233a is directed upwards from a lower portion to an upper portion of the inner wall of the reaction tube 203 in a stacking direction of the wafers 200. That is, in a region which is arranged at a side of a wafer arrangement region in which the wafers 200 are arranged to horizontally surround the wafer arrangement region, the first nozzle 233a is installed along the wafer arrangement region. The first nozzle 233a is configured as an L-shaped long nozzle. Here, a horizontal portion of the first nozzle 233a is installed to pass through a lower sidewall of the reaction tube 203, and a vertical portion of the first nozzle 233a is installed to rise from at least one end side to the other side end of the wafer arrangement region. Gas supply holes 248a configured to supply a gas are installed in a lateral surface of the first nozzle 233a. The gas supply holes 248a can be opened toward the center of the reaction tube 203 to supply a gas toward the wafer 200. The gas supply holes 248a are installed in plural numbers in a space spanning from the lower portion to the upper portion of the reaction tube 203, and each has the same opening area. Also, the gas supply holes 248a are installed at the same opening pitch.

In general, a first gas supply system includes the first gas supply pipe 232a, the mass flow controller 241a, and the valve 243a. Also, the first gas supply system may include the first nozzle 233a. Also, a first inert gas supply system generally includes the first inert gas supply pipe 232e, the mass flow controller 241e, and the valve 243e. The first inert gas supply system functions as a purge gas supply system.

A mass flow controller (MFC) 241b that is a flow rate control device (a flow rate control unit) and a valve 243b serving as an opening/closing valve are installed at the second gas supply pipe 232b sequentially from an upstream side thereof. Also, a second inert gas supply pipe 232f is connected to the second gas supply pipe 232b at a downstream side of the valve 243b. A mass flow controller 241f that is the flow rate control device (a flow rate control unit) and a valve 243f serving as the opening/closing valve are installed at the second inert gas supply pipe 232f sequentially from an upstream side thereof. Also, the above-described second nozzle 233b is connected to a leading end of the second gas supply pipe 232b. The second nozzle 233b is installed inside a buffer chamber 237 which is a gas dispersion space.

The buffer chamber 237 is installed in an arc-shaped space between the inner wall of the reaction tube 203 and the wafer 200 so that the buffer chamber 237 is arranged in a region spanning from a lower portion to an upper portion of the inner wall of the reaction tube 203 in a stacking direction of the wafers 200. That is, in a region which is arranged on a side of the wafer arrangement region to horizontally surround the wafer arrangement region, the buffer chamber 237 is installed along the wafer arrangement region. Gas supply holes 248c configured to supply a gas are installed at in end portion of a wall of the buffer chamber 237 that is adjacent to the wafer 200. The gas supply holes 248c can be opened toward the center of the reaction tube 203 to supply a gas toward the wafers 200. The gas supply holes 248c are installed in plural numbers in a space spanning from the lower portion to the upper portion of the reaction tube 203, and each has the same opening area. Also, the gas supply holes 248a are installed at the same opening pitch.

The second nozzle 233b is installed on an end portion that is opposite to an end portion of the buffer chamber 237 in which the gas supply holes 248c are installed so as to rise from the lower portion to the upper portion of the inner wall of the reaction tube 203 in a stacking direction of the wafers 200. That is, in a region which is arranged on a side of the wafer arrangement region to horizontally surround the wafer arrangement region, the second nozzle 233b is installed along the wafer arrangement region. The second nozzle 233b is configured as an L-shaped long nozzle. Here, a horizontal portion of the second nozzle 233b is installed to pass through the lower sidewall of the reaction tube 203, and a vertical portion of the second nozzle 233b is installed to rise from at least one side end to the other side end of the wafer arrangement region. Gas supply holes 248b configured to supply a gas are installed in a lateral surface of the second nozzle 233b. The gas supply holes 248b open toward the center of the buffer chamber 237. Like the gas supply holes 248c of the buffer chamber 237, the gas supply holes 248b are installed in plural numbers in a space spanning from the lower portion to the upper portion of the reaction tube 203. Each of the plurality of gas supply holes 248b may have the same opening area spanning from an upstream side (lower portion) to a downstream side (upper portion) thereof when a difference in pressure in the buffer chamber 237 and the process chamber 201 is small, and may also have the same opening pitch. When the difference in pressure is large, each of the gas supply holes 248b may have the increased opening area spanning from the upstream side to the downstream side thereof, and may have a reduced opening pitch.

In this embodiment, when the opening area or the opening pitch of each of the gas supply holes 248*b* of the second nozzle 233*b* is adjusted from the upstream side to the downstream side as described above, a gas is ejected through each of the gas supply holes 248*b* at an amount at which the gas has a different flow velocity but substantially the same flow rate. Then, the gas ejected through each of the gas supply holes 248*b* is first introduced into the buffer chamber 237. Here, a difference in flow velocity of the gas in the buffer chamber 237 is equalized. That is, the gas ejected into the buffer chamber 237 through each of the gas supply holes 248*b* of the second nozzle 233*b* is ejected into the process chamber 201 through the gas supply holes 248*c* of the buffer chamber 237 after a particle velocity of the gas in the buffer chamber 237 is slowed down. Therefore, the gas ejected into the buffer chamber 237 through each of the gas supply holes 248*b* of the second nozzle 233*b* has a uniform flow rate and flow velocity when the gas is ejected into the process chamber 201 through each of the gas supply holes 248*c* of the buffer chamber 237.

In general, a second gas supply system includes the second gas supply pipe 232*b*, the mass flow controller 241*b*, and the valve 243*b*. Also, the second gas supply system may include the second nozzle 233*b* and the buffer chamber 237. Also, a second inert gas supply system generally includes the second inert gas supply pipe 232*f*, the mass flow controller 241*f*, and the valve 243*f*. The second inert gas supply system functions as a purge gas supply system.

A mass flow controller (MFC) 241*c* that is a flow rate control device (a flow rate control unit) and a valve 243*c* serving as an opening/closing valve are installed at the third gas supply pipe 232*c* sequentially from an upstream side thereof. Also, a third inert gas supply pipe 232*g* is connected to the third gas supply pipe 232*c* at a downstream side of the valve 243*c*. A mass flow controller 241*g* that is a flow rate control device (a flow rate control unit) and a valve 243*g* serving as the opening/closing valve are installed at the third inert gas supply pipe 232*g* sequentially from an upstream side thereof. Also, a leading end of the third gas supply pipe 232*c* is connected to the second gas supply pipe 232*b* at a downstream side of the valve 243*b*.

In general, a third gas supply system includes the third gas supply pipe 232*c*, the mass flow controller 241*c*, and the valve 243*c*. Also, the third gas supply system may include a downstream side from a connection portion with the third gas supply pipe 232*c* of the second gas supply pipe 232*b*, the second nozzle 233*b* and the buffer chamber 237. Also, the third inert gas supply system generally includes the third inert gas supply pipe 232*g*, the mass flow controller 241*g*, and the valve 243*g*. The third inert gas supply system functions as a purge gas supply system.

A mass flow controller (MFC) 241*d* that is a flow rate control device (a flow rate control unit) and a valve 243*d* serving as an opening/closing valve are installed at the fourth gas supply pipe 232*d* sequentially from an upstream side thereof. Also, a fourth inert gas supply pipe 232*h* is connected to the fourth gas supply pipe 232*d* at a downstream side of the valve 243*d*. A mass flow controller 241*h* that is a flow rate control device (a flow rate control unit) and a valve 243*h* serving as the opening/closing valve are installed at the fourth inert gas supply pipe 232*h* sequentially from an upstream side thereof. Also, a leading end of the fourth gas supply pipe 232*d* is connected to the second gas supply pipe 232*b* at a downstream side of the valve 243*b*.

In general, a fourth gas supply system includes the fourth gas supply pipe 232*d*, the mass flow controller 241*d*, and the valve 243*d*. Also, the fourth gas supply system may include a downstream side from a connection portion with the fourth gas supply pipe 232*d* of the second gas supply pipe 232*b*, the second nozzle 233*b* and the buffer chamber 237. Also, the fourth inert gas supply system generally includes the fourth inert gas supply pipe 232*h*, the mass flow controller 241*h*, and the valve 243*h*. The fourth inert gas supply system functions as a purge gas supply system.

In the method of supplying a gas according to this embodiment as described above, a main stream of the gas in the reaction tube 203 is set to a direction parallel with a surface of the wafer 200, that is, a horizontal direction of the wafer 200, by transferring the gas via the nozzles 233*a* and 233*b* and the buffer chamber 237 which are disposed in an arc-shaped, vertically long space defined by the inner wall of the reaction tube 203 and end portions of the plurality of stacked wafers 200, and ejecting the gas in the reaction tube 203 for the first time from the vicinity of the wafer 200 through the gas supply holes 248*a*, 248*b* and 248*c*, each of which is opened toward the buffer chamber 237 and the nozzles 233*a* and 233*b*. The gas may be uniformly supplied onto each of the wafers 200 through such a configuration. Thus, a thin film formed on each of the wafers 200 may have a uniform film thickness. Also, a residual gas remaining after the reaction flows toward the exhaust port, that is, an exhaust pipe 231 as will described below. However, a flowing direction of the residual gas is properly determined according to a position of the exhaust port, and is not limited to a vertical direction.

As a source gas containing a predetermined element, that is, a source gas (a silicon-containing gas) containing silicon (Si) serving as the predetermined element, for example, hexachlorodisilane ($Si_2Cl_6$, abbreviated to "HCDS") gas is supplied into the process chamber 201 from the first gas supply pipe 232*a* via the mass flow controller 241*a*, the valve 243*a* and the first nozzle 233*a*. That is, the first gas supply system is configured as the source gas supply system (a silicon-containing gas supply system). Also, when a liquid source material that is in a liquid state at normal temperature and pressure such as HCDS is used, the liquid source material is evaporated using an evaporation system such as an evaporator or a bubbler, and supplied as the source gas. In this case, an inert gas may be supplied into the first gas supply pipe 232*a* from the first inert gas supply pipe 232*e* via the mass flow controller 241*e* and the valve 243*e* at the same time.

As a gas containing nitrogen (a nitrogen-containing gas), that is, a nitriding gas, for example, ammonia ($NH_3$) gas is supplied into the process chamber 201 from the second gas supply pipe 232*b* via the mass flow controller 241*b*, the valve 243*b*, the second nozzle 233*b* and the buffer chamber 237. That is, the second gas supply system is configured as a nitrogen-containing gas supply system (a nitriding gas supply system). In this case, the inert gas may be supplied into the second gas supply pipe 232*b* from the second inert gas supply pipe 232*f* via the mass flow controller 241*f* and the valve 243*f* at the same time.

As a gas containing oxygen (an oxygen-containing gas), that is, an oxidizing gas, for example, oxygen ($O_2$) gas is supplied into the process chamber 201 from the third gas supply pipe 232*c* via the mass flow controller 241*c*, the valve 243*e*, the second gas supply pipe 232*b*, the second nozzle 233*b* and the buffer chamber 237. That is, the third gas supply system is configured as an oxygen-containing gas supply system (an oxidizing gas supply system). In this case, the inert gas may be supplied into the third gas supply pipe 232*c* from the third inert gas supply pipe 232*g* via the mass flow controller 241*g* and the valve 243*g*.

As a gas containing hydrogen (a hydrogen-containing gas), that is, a reducing gas, for example, hydrogen ($H_2$) gas is supplied into the process chamber 201 from the fourth gas supply pipe 232d via the mass flow controller 241d, the valve 243d, the second gas supply pipe 232b, the second nozzle 233b and the buffer chamber 237. That is, the fourth gas supply system is configured as a hydrogen-containing gas supply system (a reducing gas supply system). In this case, the inert gas may be supplied into the fourth gas supply pipe 232d from the fourth inert gas supply pipe 232h via the mass flow controller 241h and the valve 243h at the same time.

In this embodiment, the $NH_3$ gas, the $O_2$ gas and the $H_2$ gas are also supplied into the process chamber 201 (or the buffer chamber 237) from the same nozzle, but may be supplied into the process chamber 201 from respective nozzles, and only the $H_2$ gas may be supplied into the process chamber 201 from another nozzle. The number of the nozzles may be reduced when a nozzle is shared between plural kinds of gases, the cost of devices may be saved, and a maintenance task may be easily handled. Also, the $H_2$ gas and the HCDS gas may be supplied into the process chamber 201 from the same nozzle. In a film formation temperature range as will be described below, the $H_2$ gas and the HCDS gas do not react with each other, but the $NH_3$ gas may react with the HCDS gas and the $O_2$ gas may react with the HCDS gas. Thus, a nozzle configured to supply the $NH_3$ gas or $O_2$ gas may be installed separately from a nozzle configured to supply the HCDS gas.

A first rod-shaped electrode 269 that is a first electrode and a second rod-shaped electrode 270 that is a second electrode, both of which have a slender and long structure, are arranged from a lower portion to an upper portion of the processing pipe 203 in a stacking direction of the wafers 200 in the buffer chamber 237, as shown in FIG. 2. Each of the first rod-shaped electrode 269 and the second rod-shaped electrode 270 is installed to be parallel with the second nozzle 233b. Each of the first rod-shaped electrode 269 and the second rod-shaped electrode 270 is covered and protected with an electrode protection pipe 275 that is a protection pipe configured to protect each of the electrodes spanning from an upper portion to a lower portion of the electrode protection pipe 275. Either the first rod-shaped electrode 269 or the second rod-shaped electrode 270 is connected to the high-frequency power source 273 via the impedance matching unit 272, and the other electrode is connected to an earth that is a reference electric potential. When high-frequency electric power is applied between the first rod-shaped electrode 269 and the second rod-shaped electrode 270 from the high-frequency power source 273 via the impedance matching unit 272, plasma is generated at a plasma-generating region 224 between the first rod-shaped electrode 269 and the second rod-shaped electrode 270. Generally, a plasma source serving as a plasma generator (a plasma generating unit) includes the first rod-shaped electrode 269, the second rod-shaped electrode 270, and the electrode protection pipe 275. Also, the plasma source may include the impedance matching unit 272 and the high-frequency power source 273. Also, the plasma source functions as an activation mechanism configured to activate a gas with the plasma, as will be described below.

The electrode protection pipe 275 has a structure in which the first rod-shaped electrode 269 and the second rod-shaped electrode 270 may be inserted into the buffer chamber 237 in a state in which each of the first rod-shaped electrode 269 and the second rod-shaped electrode 270 is isolated from an atmosphere of the buffer chamber 237. Here, when a concentration of oxygen in the electrode protection pipe 275 is identical to an oxygen concentration of an external environment (an atmosphere), each of the first rod-shaped electrode 269 and the second rod-shaped electrode 270 inserted into the electrode protection pipe 275 is oxidized with heat from the heater 207. Therefore, when an inside of the electrode protection pipe 275 is filled with an inert gas such as nitrogen gas, or when the inside of the electrode protection pipe 275 is purged with the inert gas such as nitrogen gas using an inert gas purge mechanism, an oxygen concentration in the electrode protection pipe 275 may be reduced to prevent oxidation of the first rod-shaped electrode 269 or the second rod-shaped electrode 270.

The exhaust pipe 231 configured to exhaust an atmosphere in the process chamber 201 is installed at the reaction tube 203. A vacuum pump 246 serving as a vacuum exhaust device is connected to the exhaust pipe 231 via a pressure sensor 245 serving as a pressure detector (a pressure detection unit) and an auto pressure controller (APC) valve 244 serving as a pressure regulator (a pressure regulating unit), both of which are configured to detect a pressure in the process chamber 201. Also, the APC valve 244 may be configured to perform the vacuum exhaust or vacuum exhaust stop in the process chamber 201 through opening/closing of the valve in a state in which the vacuum pump 246 is driven. Also, the APC valve 244 may be configured to regulate a pressure in the process chamber 201 by adjusting an opening degree of the valve in a state in which the vacuum pump 246 is driven. In general, an exhaust system includes the exhaust pipe 231, the APC valve 244, and the pressure sensor 245. Also, the exhaust system may include the vacuum pump 246. The exhaust system is configured to be able to vacuum-exhaust an inside of the process chamber 201 so that a pressure in the process chamber 201 reaches a predetermined pressure (degree of vacuum) by adjusting a valve opening degree of the APC valve 244 based on pressure information detected by the pressure sensor 245 while driving the vacuum pump 246.

As furnace port lid capable of hermetically closing a lower end opening of the reaction tube 203, a seal cap 219 is installed below the reaction tube 203. The seal cap 219 is configured to come in contact with a lower end of the reaction tube 203 in a vertical direction from a lower portion thereof. For example, the seal cap 219 is made of a metal such as stainless steel, and formed in a disk shape. An O-ring 220 serving as a seal in contact with the lower end of the reaction tube 203 is installed on an upper surface of the seal cap 219. A rotary mechanism 267 configured to rotate the boat 217 and serve as a substrate retaining mechanism as will be described below is installed at a side of the seal cap 219 which is opposite to the process chamber 201. A rotating shaft 255 of the rotary mechanism 267 is connected to the boat 217 through the seal cap 219. The rotary mechanism 267 is configured to rotate the wafer 200 by rotating the boat 217. The seal cap 219 is configured to be vertically raised or lowered by a boat elevator 115 serving as an elevation mechanism vertically installed outside the reaction tube 203. The boat elevator 115 is configured to be able to load and unload the boat 217 to and from the process chamber 201 by raising and lowering the seal cap 219. That is, the boat elevator 115 is configured as a transfer device (a transfer mechanism) configured to transfer the boat 217, that is, the wafer 200, into/from the process chamber 201.

As a substrate supporting stage, the boat 217 is made, for example, of a heat-resistant material such as quartz or silicon carbide, and configured to support the plurality of wafers 200 in multiple stages in a state in which the wafers 200 are also concentrically arranged in a horizontal posture. Also, a heat insulating member 218 made of, for example, a heat-resistant material such as quartz or silicon carbide is configured to be installed at a lower portion of the boat 217, and configured to transfer heat from the heater 207 toward the seal cap 219. Also, the heat insulating member 218 may include a plurality of heat insulating plates made of a heat-resistant material such as quartz or silicon carbide, and a heat insulating plate retainer configured to support the heat insulating plates in multiple stages in a horizontal posture.

A temperature sensor 263 serving as a temperature detector is installed in the reaction tube 203, and configured so that a temperature in the process chamber 201 has a desired temperature distribution by adjusting a state of electricity communication into the heater 207 based on temperature information detected by the temperature sensor 263. The temperature sensor 263 is formed in an L shape like the first nozzle 233a and the second nozzle 233b, and installed along the inner wall of the reaction tube 203.

Figure 3:
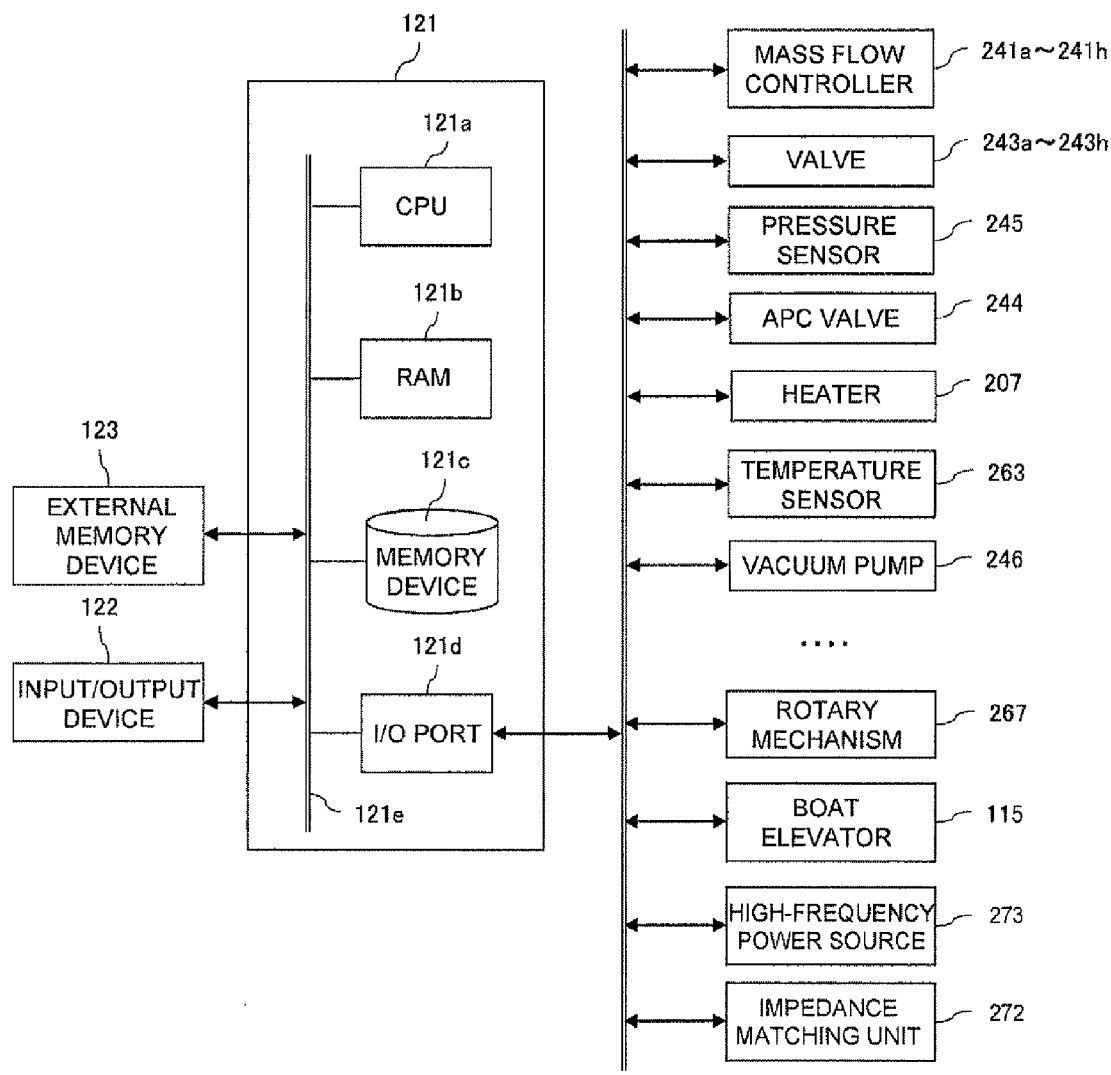
FIG. 3 is a schematic configuration diagram of a controller of the substrate processing apparatus which is preferably used in one embodiment of the present invention.

As shown in FIG. 3, a controller 121 serving as a control unit (a control means) is configured as a computer which includes a central processing unit (CPU) 121a, a random access memory (RAM) 121b, a memory device 121c, and an I/O port 121d. The RAM 121b, the memory device 121c and the I/O port 121d are configured to be able to exchange data with the CPU 121a via an internal bus 121e. For example, an input/output device 122 formed as a touch panel is connected to the controller 121.

For example, the memory device 121c includes a flash memory, a hard disk drive (HDD) and the like. A control program configured to control operation of the substrate processing apparatus or a process recipe describing the sequence and conditions for processing a substrate as will be described below are stored in the memory device 121c so that the control program and the process recipe are read from the memory device 121c. Also, the process recipe is combined so that predetermined results are obtained by executing the respective sequences at the controller 121 in a substrate processing process as will be described below, and thus functions as a program. Hereinafter, both of the process recipe and the control program are simply referred to as a program. Also, when the term "program" is used in this specification, there are cases in which the program includes only a single process recipe, includes only a single control program, or includes both of the process recipe and the control program. Also, the RAM 121b is configured as a memory area (a work area) to temporarily retain a program or data read by the CPU 121a.

The I/O port 121d is connected to the mass flow controllers 241a, 241b, 241c, 241d, 241e, 241f, 241g and 241h, the valves 243a, 243b, 243c, 243d, 243e, 243f, 243g and 243h, the pressure sensor 245, the APC valve 244, the vacuum pump 246, the heater 207, the temperature sensor 263, the rotary mechanism 267, the boat elevator 115, the high-frequency power source 273 and the impedance matching unit 272, as described above.

The CPU 121a is configured to read the process recipe from the memory device 121c according to input of an operation command from the input/output device 122 while reading the control program from the memory device 121c and executing the control program. Based on the read contents of the process recipe, the CPU 121a is configured to control an operation of adjusting flow rates of various gases by means of the mass flow controllers 241a, 241b, 241c, 241d, 241e, 241f, 241g and 241h; an opening/closing operation of the valves 243a, 243b, 243c, 243d, 243e, 243f, 243g and 243h; an opening/closing operation of the APC valve 244 and a pressure regulating operation by means of the valve 244 based on the pressure sensor 245; a temperature adjusting operation of the heater 207 based on the temperature sensor 263; start and stop of the vacuum pump 246; an operation of rotating the boat 217 and adjusting a rotational velocity of the boat 217 by means of the rotary mechanism 267; an operation of raising/lowering the boat 217 by means of the boat elevator 115; power supply of the high-frequency power source 273; and an impedance adjusting operation by means of the impedance matching unit 272.

Also, the present invention is not limited to a case in which the controller 121 is configured as a dedicated computer. The controller 121 may be configured as a general-purpose computer. For example, the controller 121 according to this embodiment may be configured by preparing an external memory device 123 in which the above-described program is stored (for example, a magnetic disk such as a magnetic tape, a flexible disk or a hard disk, an optical disc such as CD or DVD, a magneto-optical disc such as MO, and a semiconductor memory such as a USB memory or a memory card), and installing a program on a general-purpose computer using such an external memory device 123. Also, a method of supplying a program to a computer is not limited to a case in which the program is supplied to the computer via the external memory device 123. For example, the program may be supplied using a communication means such as the Internet or a dedicated line without using the external memory device 123. Also, the memory device 121c or the external memory device 123 is configured as a computer-readable recording medium. Hereinafter, these devices are simply referred to as a recording medium. Also, when the term "recording medium" is used in this specification, there are cases in which the recording medium includes only a single memory device 121c, includes only a single external memory device 123, or includes both of the memory device 121c and the external memory device 123.

(2) Substrate Processing Process

Figure 4:
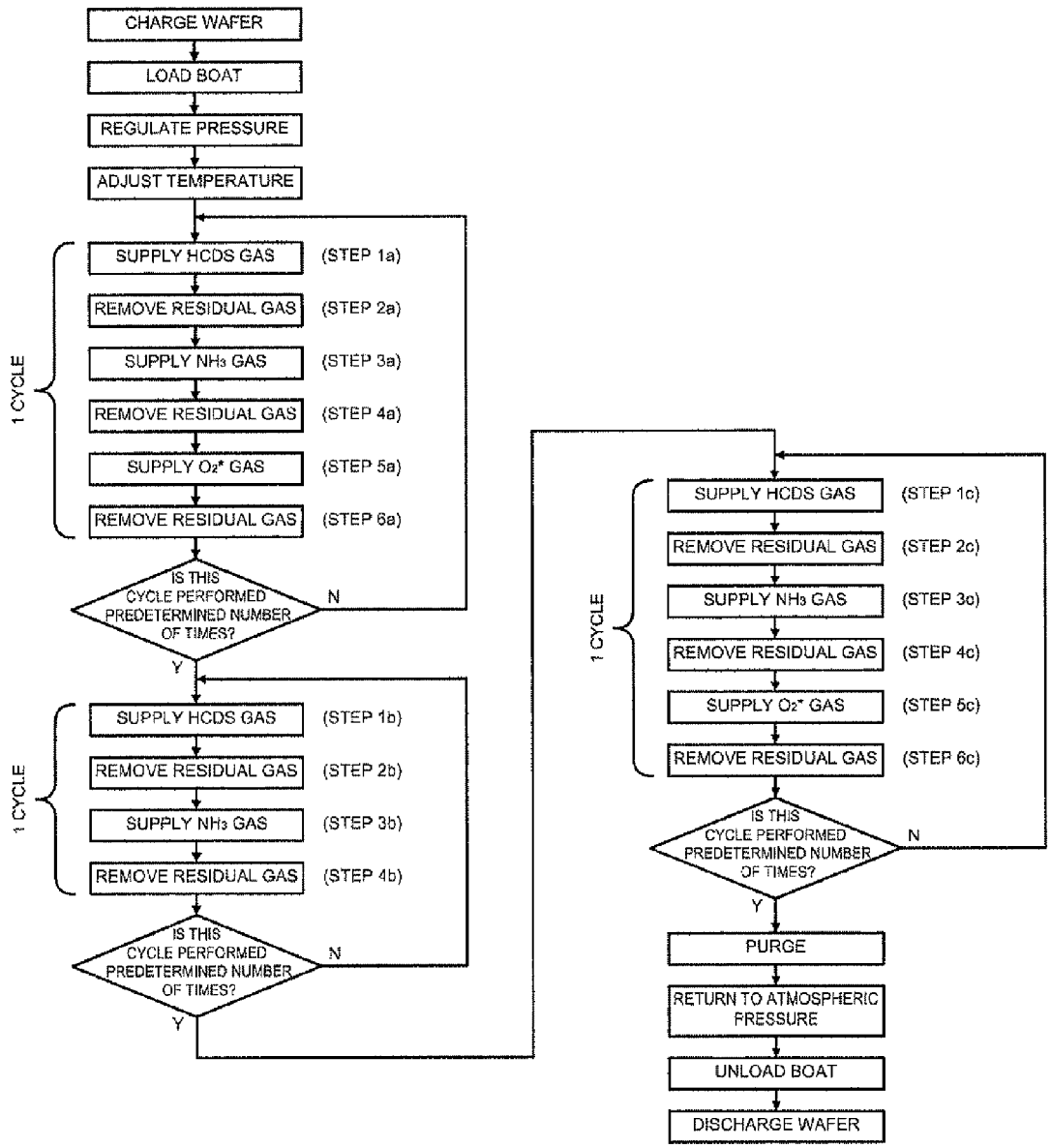
FIG. 4 is a diagram showing a film formation flow according to a first embodiment of the present invention.
Figure 9:
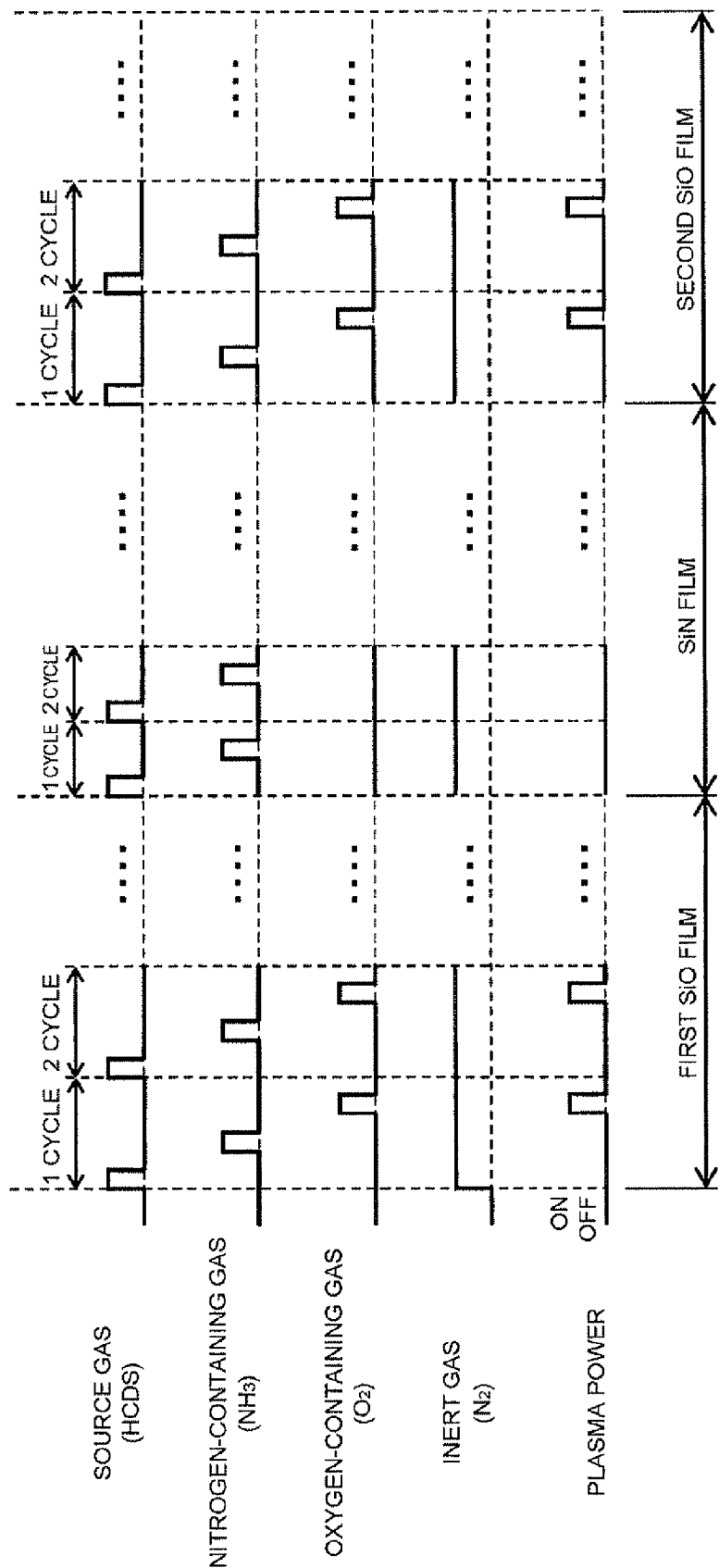
FIG. 9 is a diagram showing a gas supply timing according to the first embodiment of the present invention.

Next, as one process of manufacturing a semiconductor device using the processing furnace of the above-described substrate processing apparatus, one example in which an insulating film having an ONO-stacked structure obtained by sequentially stacking a first oxide film, a nitride film and a second oxide film is formed on a substrate will be described with reference to FIGS. 4 and 9. FIG. 4 is a diagram showing a film formation flow according to this embodiment. FIG. 9 is a diagram showing the gas supply timing according to this embodiment. In the following description, operations of parts constituting the substrate processing apparatus are independently controlled by the controller 121.

According to this embodiment, the method of manufacturing a semiconductor device includes:

forming a first oxide film on a substrate in a processing container by performing a first cycle a predetermined number of times, the first cycle including supplying a source gas to the substrate, supplying a nitriding gas (a nitrogen-containing gas) to the substrate and supplying an oxidizing gas (an oxygen-containing gas) to the substrate;

forming a nitride film on the first oxide film by performing a second cycle a predetermined number of times, the second cycle including supplying the source gas to the substrate in the processing container and supplying the nitriding gas (a nitrogen-containing gas) to the substrate; and forming a second oxide film on the nitride film by performing a third cycle a predetermined number of times, the third cycle including supplying the source gas to the substrate in the processing container, supplying the nitriding gas (a nitrogen-containing gas) to the substrate and supplying the oxidizing gas (an oxygen-containing gas) to the substrate. Here, the forming of the first oxide film, the forming of the nitride film and the forming of the second oxide film are consecutively performed while retaining a temperature of the substrate constant.

That is, according to this embodiment, the forming of the first oxide film on the substrate by repeatedly performing the supplying of the source gas to the substrate in the processing container whose inner part is under a pressure less than atmospheric pressure, the supplying of the nitrogen-containing gas to the substrate and the supplying of the oxygen-containing gas to the substrate; the forming of the nitride film on the first oxide film by repeatedly performing the supplying of the source gas to the substrate in the processing container whose inner part is under a pressure less than atmospheric pressure and the supplying of the nitrogen-containing gas to the substrate; and the forming of the second oxide film on the nitride film by repeatedly performing the supplying of the source gas to the substrate in the processing container whose inner part is under a pressure less than atmospheric pressure, the supplying of the nitrogen-containing gas to the substrate and the supplying of the oxygen-containing gas to the substrate are performed.

Here, the forming of the first oxide film, the forming of the nitride film and the forming of the second oxide film are consecutively performed while retaining a temperature of the substrate constant.

Also, each of the forming of the first oxide film and the forming of the second oxide film according to this embodiment is performed by performing a cycle including supplying the source gas, supplying the nitrogen-containing gas and supplying the oxygen-containing gas. Here, the forming of the first oxide film and the forming of the second oxide film are performed by activating the oxygen-containing gas with plasma and supplying the activated oxygen-containing gas.

Also, the forming of the nitride film according to this embodiment is performed by performing one cycle multiple times, which includes supplying the source gas and supplying the nitrogen-containing gas. Here, the forming of the nitride film is performed by activating the nitrogen-containing gas with heat or plasma and supplying the activated nitrogen-containing gas.

Hereinafter, the film formation sequence of this embodiment will be described in detail. Here, the HCDS gas, the $NH_3$ gas, the $O_2$ gas and the $N_2$ gas are used as the source gas, the nitrogen-containing gas, the oxygen-containing gas and the purge gas, respectively. A silicon oxide film (an $SiO_2$ film, hereinafter referred to as a "first silicon oxide film or first SiO film") serving as the first oxide film is formed on a wafer 200 serving as the substrate. Thereafter, the HCDS gas, the $NH_3$ gas and the $N_2$ gas are used as the source gas, the nitrogen-containing gas, and the purge gas, respectively. A silicon nitride film (an $Si_3N_4$ film, hereinafter referred to as an "SiN film") serving as the nitride film is formed on a first silicon oxide film serving as an underlying film. Then, the HCDS gas, the $NH_3$ gas, the $O_2$ gas and the $N_2$ gas are used as the source gas, the nitrogen-containing gas, the oxygen-containing gas and the purge gas, respectively. A silicon oxide film (an $SiO_2$ film, hereinafter referred to as a "second silicon oxide film or second SiO film") serving as the second oxide film is formed on the silicon nitride film serving as the underlying film. Thus, an insulating film having an ONO stacked structure obtained by stacking the first silicon oxide film, the silicon nitride film and the second silicon oxide film is formed on the wafer 200. As will be described below, the forming of the first silicon oxide film, the forming of the silicon nitride film, and the forming of the second silicon oxide film are also consecutively performed in the same processing container (in situ) while retaining a temperature of the wafer 200 within the same temperature range.

Also, the term "wafer" used in this specification means "a wafer itself," or "a stacked body (an assembly) including a wafer and a predetermined layer or film formed on a surface of the wafer" (that is, it also refers to a wafer having a predetermined layer or film formed on a surface thereof). Also, the term "surface of wafer" used in this specification means "a surface (an exposed surface) of a wafer itself," or "a surface of a predetermined layer or film formed on the wafer, that is, an outermost surface of a wafer serving as a stacked body."

Therefore, the term "supplying a predetermined gas to a wafer" disclosed in this specification means "directly supplying a predetermined gas to a surface (an exposed surface) of a wafer itself," or "supplying a predetermined gas to a layer or film formed on a wafer, that is, an outermost surface of the wafer serving as the stacked body." Also, the term "forming a predetermined layer (or a film) on a wafer" disclosed in this specification means "directly forming a predetermined layer (or a film) on a surface (an exposed surface) of a wafer itself," or "forming a predetermined layer (or a film) on a layer or film formed on a wafer, that is, an outermost surface of the wafer serving as the stacked body."

Also, the term "substrate" used in this specification has the same meaning as the term "wafer." In this case, in the description, the terms "wafer" and "substrate" may be used interchangeably.

(Wafer Charging and Boat Loading)

When the plurality of wafers 200 are charged into the boat 217 (wafer charging), the boat 217 that supports the plurality of wafers 200 is raised by means of the boat elevator 115 to be loaded into the process chamber 201 (boat loading), as shown in FIG. 1. In this state, the seal cap 219 is configured to seal a lower end of the reaction tube 203 via the O-ring 220.

(Pressure Regulation and Temperature Adjustment)

An inside of the process chamber 201 is vacuum-exhausted by means of the vacuum pump 246 so that the inside of the process chamber 201 reaches a desired pressure (degree of vacuum). In this case, the pressure in the process chamber 201 is measured by the pressure sensor 245, and the APC valve 244 is feedback-controlled based on the measured pressure information (pressure regulation). Also, the vacuum pump 246 remains activated all the times until at least the processing of the wafers 200 is completed. Also, the inside of the process chamber 201 is heated by the heater 207 so that the inside of the process chamber 201 reaches a desired temperature. In this case, a state of electricity communication into the heater 207 is feedback-controlled based on temperature information detected by the temperature sensor 263 so that the inside of the process chamber 201 has a desired temperature distribution (temperature adjustment). Also, the heating of the inside of the process chamber 201 using the heater 207 continues to be performed until at least the processing of the wafers 200 is completed. Subsequently, the boat 217 and wafer 200 start to rotate by means of the rotary mechanism 267. Also, the rotation of the boat 217 and the wafer 200 using the rotary mechanism 267 continues to be performed until at least the processing of the wafers 200 is completed.

(Forming First Silicon Oxide Film)

Next, a first silicon oxide film having a predetermined film thickness is formed on the wafer 200 by performing one cycle multiple times, which includes the following Steps 1a to 6a.

[Step 1a]

The valve 243a of the first gas supply pipe 232a is opened to allow the HCDS gas to flow through the first gas supply pipe 232a. The HCDS gas is allowed to flow from the first gas supply pipe 232a to adjust a flow rate using the mass flow controller 241a. The HCDS gas whose flow rate is adjusted is supplied into the heated process chamber 201 whose inner part is in a reduced pressure state through the gas supply holes 248a of the first nozzle 233a, and exhausted through the exhaust pipe 231 (HCDS gas supplying).

In this case, the valve 243e of the first inert gas supply pipe 232e may be opened to supply the N₂ gas serving as the inert gas through the first inert gas supply pipe 232e. A flow rate of the N₂ gas is adjusted by means of the mass flow controller 241e so that the N₂ gas is supplied into the first gas supply pipe 232a. The N₂ gas whose flow rate is adjusted is mixed with the HCDS gas whose flow rate is adjusted in the first gas supply pipe 232a, supplied into the heated process chamber 201 whose inner part is in a reduced pressure state through the gas supply holes 248a of the first nozzle 233a, and exhausted through the exhaust pipe 231. In this case, to prevent invasion of the HCDS gas into the buffer chamber 237 or the second nozzle 233b, the valves 243f, 243g and 243h are also opened to allow the N₂ gas to flow into the second inert gas supply pipe 232f, the third inert gas supply pipe 232g and the fourth inert gas supply pipe 232h. The N₂ gas is supplied into the process chamber 201 via the second gas supply pipe 232b, the third gas supply pipe 232c, the fourth gas supply pipe 232d, the second nozzle 233b, and the buffer chamber 237, and exhausted through the exhaust pipe 231.

In this case, an opening degree of the APC valve 244 is properly adjusted to maintain a pressure in the process chamber 201 at a pressure less than atmospheric pressure, for example, at a pressure of 10 to 1,000 Pa. For example, a supply flow rate of the HCDS gas controlled by the mass flow controller 241a is set to a flow rate of 10 to 1,000 sccm (0.01 to 1 slm). Each supply flow rate of the N₂ gas controlled by the mass flow controllers 241e, 241f, 241g and 241h is, for example, set to a flow rate of 100 to 2,000 sccm (0.1 to 2 slm). For example, a time required to supply the HCDS gas to the wafer 200, that is, a gas supply time (irradiation time), is set to a time range of 1 to 120 seconds. A temperature of the heater 207 is set so that the temperature of the heater 207 reaches a temperature at which a CVD reaction takes place in the process chamber 201 within the above-described pressure range. That is, the temperature of the heater 207 is, for example, set so that a temperature of the wafer 200 reaches a temperature of 350 to 700° C. Also, when the temperature of the wafer 200 is less than 350° C., HCDS on the wafer 200 is decomposed, and thus is not easily adsorbed. Also, when the temperature of the wafer 200 exceeds 700° C., the CVD reaction is strongly caused, and thus the uniformity of film thickness is significantly damaged. Therefore, the temperature of the wafer 200 is preferably in a range of 350 to 700° C.

A silicon-containing layer having a thickness of less than one atomic layer to several atomic layers is, for example, formed on the wafer 200 (an underlying film on a surface of the wafer 200) by supplying the HCDS gas into the process chamber 201 under the above-described condition, that is, a condition in which the CVD reaction takes place. The silicon-containing layer may be an adsorption layer of HCDS gas, or a silicon layer (a Si layer), and may include both of the adsorption layer of HCDS gas and the silicon layer. However, the silicon-containing layer is preferably a layer containing silicon (Si) and chlorine (Cl).

Here, the silicon layer generally refers to all layers including a discontinuous layer and a silicon thin film obtained by stacking the discontinuous layers in addition to a continuous layer formed of silicon (Si). Also, the continuous layer formed of Si may be often referred to as a silicon thin film. Also, Si constituting the silicon layer includes Si from which a bond with Cl is completely separated.

Also, the adsorption layer of HCDS gas includes a discontinuous chemical adsorption layer in addition to a continuous chemical adsorption layer formed of gas molecules of the HCDS gas. That is, the adsorption layer of HCDS gas includes a chemical adsorption layer having a thickness of one or less than one molecular layer, which is formed of HCDS molecules. Also, the HCDS (Si₂Cl₆) molecules constituting the adsorption layer of HCDS gas include molecules from which a bond between Si and Cl is partly separated (Si$_x$Cl$_y$ molecules). That is, the adsorption layer of HCDS gas includes a continuous chemical adsorption layer or a discontinuous chemical adsorption layer of Si₂Cl₆ molecules and/or Si$_x$Cl$_y$ molecules. Also, a layer having a thickness of less than one atomic layer means a discontinuously formed atomic layer, and a layer having a thickness of one atomic layer means a continuously formed atomic layer. Also, the layer having a thickness of less than one atomic layer means a discontinuously formed molecular layer, and the layer having a thickness of one atomic layer means a continuously formed molecular layer.

The silicon layer is formed by depositing Si on the wafer 200 under the condition in which the HCDS gas is self-decomposed (pyrolyzed), that is, the conditions in which pyrolysis of the HCDS takes place. The adsorption layer of HCDS gas is formed by adsorbing the HCDS gas onto the wafer 200 under the conditions in which the HCDS gas is not self-decomposed (pyrolyzed), that is, the conditions in which pyrolysis of the HCDS does not take place. Also, forming the silicon layer on the wafer 200 is desirable compared with forming the adsorption layer of HCDS gas on the wafer 200 since a film formation rate may be enhanced through the formation of the silicon layer.

When the silicon-containing layer formed on the wafer 200 has a thickness of more than several atomic layers, a modifying action does not have an effect on the entire silicon-containing layer in Steps 3a and 5a as will be described below. Also, the thickness of the silicon-containing layer formed on the wafer 200 has a minimum value of less than one atomic layer. Therefore, the silicon-containing layer preferably has a thickness of less than one atomic layer to several atomic layers. Also, when the silicon-containing layer has a thickness of less than one atomic layer, that is, one or less than one atomic layer, an action of the modifying reaction in Steps 3a and 5a as will be described below may be relatively high. Thus, a time required to perform the modifying reaction of Steps 3a and 5a may be shortened. A time required to form the silicon-containing layer of Step 1a may be shortened. As a result, a processing time per one cycle can be shortened, and thus the processing time in total can be shortened. That is, improvement of the film formation rate is possible. Also, when the silicon-containing layer has a thickness of one or less atomic layer, controllability of film thickness uniformity can also be improved.

In addition to hexachlorodisilane (Si₂Cl₆, abbreviated to HCDS) gas, an inorganic source material such as tetrachlorosilane, that is, silicon tetrachloride (SiCl₄, abbreviated to STC) gas, trichlorosilane (SiHCl₃, abbreviated to TCS) gas, dichlorosilane (SiH₂Cl₂, abbreviated to DCS) gas, monochlorosilane (SiH₃Cl, abbreviated to MCS) gas, or monosilane (SiH₄) gas, and also an organic source material such as aminosilane-based tetrakisdimethylaminosilane (Si[N(CH₃)₂]₄, abbreviated to 4DMAS) gas, trisdimethylaminosilane (Si[N(CH₃)₂]₃H, abbreviated to 3DMAS) gas, bisdiethylaminosilane (Si[N(C₂H₅)₂]₂H₂, abbreviated to 2DEAS) gas, or bis tert-butylaminosilane (SiH₂[NH(C₄H₉)]₂, abbreviated to BTBAS) gas may be used as the source gas (a silicon-containing gas). In addition to the N₂ gas, a rare gas such as Ar gas, He gas, Ne gas, or Xe gas may be used as the inert gas.

[Step 2a]

After the silicon-containing layer is formed on the wafer 200, the valve 243a of the first gas supply pipe 232a is closed, and the supply of the HCDS gas is suspended. In this case, the APC valve 244 of the exhaust pipe 231 is kept open and an inside of the process chamber 201 is vacuum-exhausted by means of the vacuum pump 246, so that an unreacted gas remaining in the process chamber 201 or the HCDS gas after contributing to formation of the silicon-containing layer is eliminated from the process chamber 201. Also, the valves 243e, 243f, 243g and 243h are kept open to maintain the supply of the $N_2$ gas serving as the inert gas into the process chamber 201. The $N_2$ gas functions as a purge gas, and thus may further improve an effect of eliminating an unreacted gas remaining in the process chamber 201 or the HCDS gas after contributing to formation of the silicon-containing layer from the process chamber 201 (residual gas removal).

In this case, a gas remaining in the process chamber 201 may not be completely eliminated, or an inside of the process chamber 201 may not be completely purged. When a trace of the gas remains in the process chamber 201, adverse effects do not take place in Step 3a which will be subsequently performed. In this case, an increase in flow rate of the $N_2$ gas supplied into the process chamber 201 is unnecessary. For example, when the $N_2$ gas is supplied at substantially the same amount as a capacity of the reaction tube 203 (a process chamber 201), purging may be performed to an extent to which no adverse effects take place in Step 3a. As described above, when the inside of the process chamber 201 is not completely purged, a purging time may be shortened, and throughput may be improved. Also, consumption of the $N_2$ gas can be minimized.

In this case, a temperature of the heater 207 is set to a temperature of 350 to 700° C., a range of which is identical to that in the supply of the HCDS gas. A supply flow rate of the $N_2$ gas serving as the purge gas supplied from each inert gas supply system is, for example, set to a flow rate of 100 to 2,000 sccm (0.1 to 2 slm). In addition to the $N_2$ gas, a rare gas such as Ar, He, Ne or Xe may be used as the purge gas.

[Step 3a]

After the residual gas in the process chamber 201 is removed, the valve 243b of the second gas supply pipe 232b is opened to allow the $NH_3$ gas to flow through the second gas supply pipe 232b. The $NH_3$ gas is allowed to flow through the second gas supply pipe 232b so that a flow rate of the $NH_3$ gas is adjusted by the mass flow controller 241b. The $NH_3$ gas whose flow rate is adjusted is supplied into the heated buffer chamber 237 whose inner part is in a reduced pressure state through the gas supply holes 248b of the second nozzle 233b via the second gas supply pipe 232b. In this case, when high-frequency electric power is applied between the first rod-shaped electrode 269 and the second rod-shaped electrode 270, the $NH_3$ gas supplied into the buffer chamber 237 is activated with plasma. When the high-frequency electric power is not applied between the first rod-shaped electrode 269 and the second rod-shaped electrode 270, the $NH_3$ gas supplied into the buffer chamber 237 is not activated with heat. In this embodiment, when the high-frequency electric power is not applied between the first rod-shaped electrode 269 and the second rod-shaped electrode 270, the $NH_3$ gas supplied into the buffer chamber 237 is activated with heat. Therefore, the $NH_3$ gas supplied into the buffer chamber 237 is activated with heat so that the $NH_3$ gas is supplied into the heated process chamber 201 whose inner part is in a reduced pressure state through the gas supply holes 248c of the buffer chamber 237 and exhausted through the exhaust pipe 231 ($NH_3$ gas supplying). Also, the $NH_3$ gas may be activated with plasma. However, when the $NH_3$ gas is activated with heat and supplied, a soft reaction may be caused, and nitriding as will be described below may be softly performed.

In this case, the valve 243f of the second inert gas supply pipe 232f may be opened to supply the $N_2$ gas as the inert gas through the second inert gas supply pipe 232f. A flow rate of the $N_2$ gas is adjusted by the mass flow controller 241f so that the $N_2$ gas is supplied into the second gas supply pipe 232b. The $N_2$ gas whose flow rate is adjusted is mixed with the $NH_3$ gas whose flow rate is adjusted in the second gas supply pipe 232b, supplied into the heated buffer chamber 237 whose inner part is in a reduced pressure state through the gas supply holes 248b of the second nozzle 233b, supplied into the heated process chamber 201 whose inner part is in a reduced pressure state through the gas supply holes 248c of the buffer chamber 237, and exhausted through the exhaust pipe 231. In this case, to prevent invasion of the $NH_3$ gas into the first nozzle 233a, the third gas supply pipe 232c or the fourth gas supply pipe 232d, the valves 243e, 243g and 243h are also opened to allow the $N_2$ gas to flow in the first inert gas supply pipe 232e, the third inert gas supply pipe 232g and the fourth inert gas supply pipe 232h. The $N_2$ gas is supplied into the process chamber 201 via the first gas supply pipe 232a, the third gas supply pipe 232c, the fourth gas supply pipe 232d, the first nozzle 233a, the second nozzle 233b and the buffer chamber 237, and exhausted through the exhaust pipe 231.

In this case, an opening degree of the APC valve 244 is properly adjusted to maintain a pressure in the process chamber 201 at a pressure less than an atmospheric pressure, for example, at a pressure of 10 to 3,000 Pa. For example, a supply flow rate of the $NH_3$ gas controlled by the mass flow controller 241b is set to a flow rate of 100 to 10,000 sccm (0.1 to 10 slm). Each supply flow rate of the $N_2$ gas controlled by the mass flow controllers 241f, 241e, 241g and 241h is, for example, set to a flow rate of 100 to 2,000 sccm (0.1 to 2 slm). For example, a time required to supply the $NH_3$ gas to the wafer 200, that is, a gas supply time (irradiation time), is set to a time range of 1 to 120 seconds. A temperature of the heater 207 is set so that a temperature of the wafer 200 reaches a temperature which is identical to that in the supply of the HCDS gas in Step 1a, that is, a temperature of 350 to 700° C. Also, it was confirmed that, when the temperature was within this range, a nitriding effect by the $NH_3$ gas under a reduced pressure atmosphere, that is, nitradation reaction of the silicon-containing layer, could be obtained. It was also confirmed that, when the temperature of the wafer 200 was extremely low, the nitriding effect could not be obtained. In consideration of the throughput, a temperature of the heater 207 is preferably set so that the temperature in the process chamber 201 is retained within the same temperature range in Steps 1a to 3a, as described above. Also, the temperature of the heater 207 is more preferably set so that the temperature in the process chamber 201 is retained within the same temperature range throughout Steps 1a to 6a (as will be described below). In this case, the temperature of the heater 207 is set so that the temperature of the process chamber 201 reaches a constant temperature ranging from 350 to 700° C. throughout Steps 1a to 6a (as will be described below).

When the $NH_3$ gas is supplied into the process chamber 201 under the above-described condition, the $NH_3$ gas is thermally activated or pyrolyzed with a non-plasma source under a hot reduced pressure atmosphere to generate a nitride species containing nitrogen. In this case, since the HCDS gas does not flow in the process chamber 201, the $NH_3$ gas does not cause a vapor-phase reaction, and the nitride species obtained by thermally activating or pyrolyzing the $NH_3$ gas reacts with at least some of the silicon-containing layer formed on the wafer 200 in Step 1a. Therefore, nitridation is performed on the silicon-containing layer, and the silicon-containing layer is converted (modified) into a silicon nitride layer (a Si$_3$N$_4$ layer, hereinafter simply referred to as an "SiN layer") through the nitridation.

In this case, the NH$_3$ gas may also be activated with plasma to flow as described above. When the NH$_3$ gas is activated with the plasma to flow, a nitride species including an active species having higher energy may be generated. Here, when the nitridation is performed with the nitride species, an effect of improving device characteristics is also considered. When the NH$_3$ gas is activated with the plasma, the NH$_3$ gas supplied into the buffer chamber 237 is activated with the plasma (excited with the plasma) by applying high-frequency electric power from the high-frequency power source 273 between the first rod-shaped electrode 269 and the second rod-shaped electrode 270 via the impedance matching unit 272. As a gas (a nitride species) containing NH$_3$* (an active species of ammonia), the NH$_3$ gas is then supplied into the process chamber 201 through the gas supply holes 248c, and exhausted through the exhaust pipe 231. In this case, the high-frequency electric power applied from the high-frequency power source 273 between the first rod-shaped electrode 269 and the second rod-shaped electrode 270 is, for example, set to have an electric power of 50 to 1,000 W. The other processing conditions are identical to the above-described processing conditions. Also, the NH$_3$ gas is sufficiently activated with heat within the above-described temperature range to generate a sufficient amount of the nitride species. Thus, a sufficient nitriding power can be achieved even when the NH$_3$ gas is thermally activated with the non-plasma source. As described above, when the NH$_3$ gas is activated with heat and supplied, a soft reaction may also take place, and thus the above-described nitridation may be softly performed.

In addition to the NH$_3$ gas, diazene (N$_2$H$_2$) gas, hydrazine (N$_2$H$_4$) gas, N$_3$H$_8$ gas or an amine-based gas may be used as the nitrogen-containing gas.

[Step 4a]

After the silicon-containing layer is converted into the silicon nitride layer, the valve 243b of the second gas supply pipe 232b is closed, and the supply of the NH$_3$ gas is suspended. In this case, the APC valve 244 of the exhaust pipe 231 is kept open and the inside of the process chamber 201 is vacuum-exhausted using the vacuum pump 246, so that an unreacted gas remaining in the process chamber 201 or the NH$_3$ gas or reaction by-products after contributing to formation of the silicon-containing layer are eliminated from the process chamber 201. Also, the valves 243f, 243e, 243g and 243h are kept open to maintain the supply of the N$_2$ gas serving as the inert gas into the process chamber 201. The N$_2$ gas functions as the purge gas, and thus may further improve an effect of eliminating an unreacted gas remaining in the process chamber 201 or the NH$_3$ gas or reaction by-products after contributing to formation of the silicon-containing layer from the process chamber 201 (residual gas removal).

In this case, a gas remaining in the process chamber 201 may not be completely eliminated, or an inside of the process chamber 201 may not be completely purged. When a trace of the gas remains in the process chamber 201, adverse effects do not take place in Step 5a which will be subsequently performed. In this case, an increase in flow rate of the N$_2$ gas supplied into the process chamber 201 is unnecessary. For example, when the N$_2$ gas is supplied at substantially the same amount as a capacity of the reaction tube 203 (a process chamber 201), purging may be performed to an extent to which no adverse effects take place in Step 5a. As described above, when the inside of the process chamber 201 is not completely purged, a purging time may be shortened, and throughput may be improved. Also consumption of the N$_2$ gas can be minimized.

In this case, a temperature of the heater 207 is set so that the temperature of the wafer 200 reaches a temperature of 350 to 700° C., a range of which is identical to that in the supply of the NH$_3$ gas. A supply flow rate of the N$_2$ gas serving as the purge gas supplied through each inert gas supply system is, for example, set to a flow rate of 100 to 2,000 sccm (0.1 to 2 slm). In addition to the N$_2$ gas, a rare gas such as Ar, He, Ne or Xe may be used as the purge gas.

[Step 5a]

After the residual gas in the process chamber 201 is removed, the valve 243c of the third gas supply pipe 232c is opened to allow the O$_2$ gas to flow in the third gas supply pipe 232c. The O$_2$ gas is allowed to flow through the third gas supply pipe 232c so that a flow rate of the O$_2$ gas is adjusted using the mass flow controller 241c. The O$_2$ gas whose flow rate is adjusted is supplied into the heated buffer chamber 237 whose inner part is in a reduced pressure state through the gas supply holes 248b of the second nozzle 233b via the second gas supply pipe 232b. In this case, high-frequency electric power is applied between the first rod-shaped electrode 269 and the second rod-shaped electrode 270. Therefore, the O$_2$ gas supplied into the buffer chamber 237 is activated with plasma (excited with plasma). As a gas including an active species, that is, a gas (an oxide species) containing O$_2$* (an active species of oxygen), the O$_2$ gas is supplied into the process chamber 201 through the gas supply holes 248c, and exhausted through the exhaust pipe 231 (O$_2$* gas supplying).

In this case, the valve 243g of the third inert gas supply pipe 232g may be opened to supply the N$_2$ gas as the inert gas through the third inert gas supply pipe 232g. A flow rate of the N$_2$ gas is adjusted by the mass flow controller 241g so that the N$_2$ gas is supplied into the third gas supply pipe 232c. The N$_2$ gas whose flow rate is adjusted is mixed with the O$_2$ gas whose flow rate is adjusted in the third gas supply pipe 232b, supplied into the heated buffer chamber 237 whose inner part is in a reduced pressure state through the gas supply holes 248b of the second nozzle 233b, supplied into the heated process chamber 201 whose inner part is in a reduced pressure state through the gas supply holes 248c of the buffer chamber 237, and exhausted through the exhaust pipe 231. In this case, to prevent invasion of the NH$_3$ gas into the first nozzle 233a, an upstream side of the second gas supply pipe 232b, or the fourth gas supply pipe 232d, the valves 243e, 243f and 243h are also opened to allow the N$_2$ gas to flow in the first inert gas supply pipe 232e, the second inert gas supply pipe 232f and the fourth inert gas supply pipe 232h. The N$_2$ gas is supplied into the process chamber 201 via the first gas supply pipe 232a, the second gas supply pipe 232b, the fourth gas supply pipe 232d, the first nozzle 233a, the second nozzle 233b and the buffer chamber 237, and exhausted through the exhaust pipe 231.

In this case, an opening degree of the APC valve 244 is properly adjusted to maintain a pressure in the process chamber 201 at a pressure less than atmospheric pressure, for example, at a pressure of 10 to 1,000 Pa. For example, a supply flow rate of the O$_2$ gas controlled by the mass flow controller 241c is set to a flow rate of 100 to 10,000 sccm (0.1 to 10 slm). Each supply flow rate of the N$_2$ gas controlled by the mass flow controllers 241g, 241e, 241f and 241h is, for example, set to a flow rate of 100 to 2,000 sccm (0.1 to 2 slm). For example, the high-frequency electric power applied from the high-frequency power source 273 between the first rod-shaped electrode 269 and the second rod-shaped electrode 270 is set to have an electric power of 50 to 1,000 W. Also, a time required to supply the oxide species, which is obtained by activating the $O_2$ gas with the plasma, to the wafer 200, that is, a gas supply time (irradiation time), is set to a time range of, for example, 1 to 120 seconds. A temperature of the heater 207 is set so that a temperature of the wafer 200 reaches a temperature which is identical to that in the supply of the HCDS gas in Step 1a or the supply of the $NH_3$ gas in Step 3a, that is, a temperature of 350 to 700° C. In consideration of the throughput, a temperature of the heater 207 is preferably set so that the temperature in the process chamber 201 is retained within the same temperature range in Steps 1a to 5a, as described above. As described above, the temperature of the heater 207 is more preferably set so that the temperature in the process chamber 201 is retained within the same temperature range throughout Steps 1a to 6a (as will be described below).

Oxidation is performed on the silicon nitride layer formed on the wafer 200 in Step 3a by supplying the oxide species, that is, a gas containing $O_2^*$, into the process chamber 201 under the above-described conditions, generally through action of $O_2^*$. In this case, since the HCDS gas and the $NH_3$ gas are not allowed to flow in the process chamber 201, a vapor-phase reaction does not take place. In this oxidation, N ingredients are generally separated from the silicon nitride layer due to energy of $O_2^*$ while O ingredients are added to the silicon nitride layer. Then, Si—O bonds in the silicon nitride layer are increased, but Si—N bonds and Si—Si bonds are decreased. Thus, ratios of the N ingredients and the Si ingredients in the silicon nitride layer are lowered. In particular, the ratio of the N ingredients is decreased to a level of impurities or becomes substantially null due to separation of most of the N ingredients. Then, the silicon nitride layer is converted (modified) into a silicon oxide layer (an $SiO_2$ layer, hereinafter simply referred to as an "SiO layer") due to the oxidation.

In addition to the $O_2$ gas, nitrous oxide ($N_2O$) gas, nitric oxide (NO) gas, nitrogen dioxide ($NO_2$) gas, ozone ($O_3$) gas, hydrogen ($H_2$)+oxygen ($O_2$) gas, $H_2+O_3$ gas, vapor ($H_2O$) gas, carbon monoxide (CO) gas or carbon dioxide ($CO_2$) gas may be used as the oxygen-containing gas.

[Step 6a]

After the silicon nitride layer is converted into the silicon oxide layer, the valve 243c of the third gas supply pipe 232c is closed, and the supply of the $O_2$ gas is suspended. In this case, the APC valve 244 of the exhaust pipe 231 is kept open and the inside of the process chamber 201 is vacuum-exhausted by means of the vacuum pump 246, so that an unreacted gas remaining in the process chamber 201 or the $O_2$ gas or reaction by-products after contributing to formation of the silicon-containing layer are eliminated from the process chamber 201. Also, the valves 243g, 243e, 243f and 243h are kept open to maintain the supply of the $N_2$ gas serving as the inert gas into the process chamber 201. The $N_2$ gas functions as the purge gas, and thus may further improve an effect of eliminating an unreacted gas remaining in the process chamber 201 or the $O_2$ gas or the reaction by-product gas after contributing to formation of the silicon-containing layer from the process chamber 201 (residual gas removal).

In this case, a gas remaining in the process chamber 201 may not be completely eliminated, or an inside of the process chamber 201 may not be completely purged. When a trace of the gas remains in the process chamber 201, adverse effects do not take place in Step 1a which will be subsequently performed. In this case, an increase in flow rate of the $N_2$ gas supplied into the process chamber 201 is unnecessary. For example, when the $N_2$ gas is supplied at substantially the same amount as a capacity of the reaction tube 203 (a process chamber 201), purging may be performed to an extent to which no adverse effects take place in Step 1a. As described above, when the inside of the process chamber 201 is not completely purged, a purging time may be shortened, and throughput may be improved. Also, consumption of the $N_2$ gas can be minimized.

In this case, a temperature of the heater 207 is set so that the temperature of the wafer 200 reaches a temperature of 350 to 700° C., a range of which is identical to that in the supply of the $O_2$ gas. A supply flow rate of the $N_2$ gas serving as the purge gas supplied through each inert gas supply system is, for example, set to a flow rate of 100 to 2,000 sccm (0.1 to 2 slm). In addition to the $N_2$ gas, a rare gas such as Ar, He, Ne or Xe may be used as the purge gas.

The first silicon oxide film having a predetermined film thickness may be formed on the wafer 200 by performing one cycle multiple times, which includes Steps 1a to 6a as described above. The first silicon oxide film is an underlying film of the silicon nitride film formed using a process as will be described below.

Also, in each step after the second cycle when the above-described cycle is repeatedly performed, the expression "supplying a predetermined gas to a wafer 200" means "supplying a predetermined gas to a layer formed on a wafer 200, that is, an outermost surface of the wafer 200 serving as a stacked body," and the expression "forming a predetermined layer on a wafer 200" means "forming a predetermined layer on a layer formed on a wafer 200, that is, an outermost surface of the wafer 200 serving as a stacked body." This fact is the same as described above. Also, this fact is identical in the forming of the silicon nitride film and the forming of the second silicon oxide film as will be described below, and also in another embodiment as will be described below.

(Forming Silicon Nitride Film)

Subsequently, a silicon nitride film having a predetermined film thickness is formed as the underlying film on the first silicon oxide film by performing one cycle multiple times, which includes the following Steps 1b to 4b. Also, the forming of the silicon nitride film is performed so that the temperature of the wafer 200 is retained in a temperature range that is identical to that of the wafer 200 in the forming of the first silicon oxide film as described above.

[Step 1b]

The HCDS gas (or a mixed gas of HCDS gas and $N_2$ gas) is supplied into the heated process chamber 201 whose inner part is in a reduced pressure state, and then exhausted in the same sequence under the same conditions in the forming of first silicon oxide film as described above in Step 1a (HCDS gas supplying). The processing conditions, generated reactions and formed layers in Step 1b are identical to those in the forming of the first silicon oxide film as described in Step 1a. That is, the silicon-containing layer is formed on the first silicon oxide film by supplying the HCDS gas into the process chamber 201 in this step.

[Step 2b]

After the silicon-containing layer is formed on the first silicon oxide film, an inside of the process chamber 201 is purged with the $N_2$ gas by eliminating the HCDS gas from the process chamber 201 in the same sequence under the same conditions as described in the forming of the first silicon oxide film in Step 2a (residual gas removal).

[Step 3b]

After the residual gas in the process chamber 201 is removed, the $NH_3$ gas (or a mixed gas of $NH_3$ gas and $N_2$ gas) is supplied into the heated process chamber 201 whose inner part is in a reduced pressure state, and then exhausted in the same sequence under the same conditions in the forming of first silicon oxide film as described above in Step 3a ($NH_3$ gas supplying). The processing conditions, generated reactions and formed layers in Step 3b are identical to those in the forming of the first silicon oxide film as described in Step 3a. That is, the silicon-containing layer formed in Step 1b is converted (modified) into the silicon nitride layer by supplying the $NH_3$ gas into the process chamber 201 in this step.

[Step 4b]

After the silicon-containing layer is converted into the silicon nitride layer, an inside of the process chamber 201 is purged with $N_2$ gas by eliminating the $NH_3$ gas or reaction by-products from the process chamber 201 in the same sequence under the same conditions as described in the forming of the first silicon oxide film in Step 4a (residual gas removal).

A silicon nitride film having a predetermined film thickness may be formed as the underlying film on the first silicon oxide film by performing one cycle multiple times, which includes Steps 1b to 4b as described above. The silicon nitride film is an underlying film of the second silicon oxide film formed using a process as will be described below.

(Forming Second Silicon Oxide Film)

Subsequently, a second silicon oxide film having a predetermined film thickness is formed on the silicon nitride film as the underlying film by performing one cycle multiple times, which includes the following Steps 1c to 6c.

Steps 1c to 6c are performed in the same sequence under the same conditions as described in the forming of the first silicon oxide film in Steps 1a to 6a. That is, the forming of the second silicon oxide film is performed so that the temperature of the wafer 200 is retained in a temperature range that is identical to those of the wafers 200 in the forming of the first silicon oxide film and the forming of the silicon nitride film as described above.

Then, the second silicon oxide film having a predetermined film thickness may be formed on the silicon nitride film by performing one cycle multiple times, which includes Steps 1c to 6c. As a result, the insulating film having an ONO stacked structure obtained by sequentially stacking the first silicon oxide film, the silicon nitride film and the second silicon oxide film is formed on the wafer 200.

(Purging and Returning to Atmospheric Pressure)

When the insulating film having an ONO stacked structure is formed, the valves 243e, 243f, 243g and 243h are opened to supply the $N_2$ gas as the inert gas into the process chamber 201 through each of the first inert gas supply pipe 232e, the second inert gas supply pipe 232f, the third inert gas supply pipe 232g and the fourth inert gas supply pipe 232h, and exhaust the $N_2$ gas through the exhaust pipe 231. The $N_2$ gas functions as the purge gas, and thus an inside of the process chamber 201 is purged with the inert gas to remove the gases or reaction by-products, which remain in the process chamber 201, from the process chamber 201 (purging). Thereafter, an atmosphere in the process chamber 201 is replaced with the inert gas so that the pressure in the process chamber 201 returns to a normal pressure (returning to atmospheric pressure).

(Boat Unloading and Wafer Discharging)

Next, the seal cap 219 is lowered by means of the boat elevator 115 to open a lower end of the reaction tube 203 and also discharge the processed wafer 200 from the reaction tube 203 through the lower end of the reaction tube 203 in a state in which the processed wafer 200 is retained by the boat 217 (boat unloading). Thereafter, the processed wafer 200 is discharged from the boat 217 (wafer discharging).

(3) Effects According to this Embodiment

According to this embodiment, one or a plurality of effects will be described, as follows.

When the first silicon oxide film and the second silicon oxide film were formed according to the film formation sequence of this embodiment, it was confirmed that the wafer 200 had good in-plane film thickness uniformity, compared with a case in which the silicon oxide film was formed using a conventional CVD method. As a result, it was confirmed that the wafer 200 including the insulating film having an ONO stacked structure had good in-plane film thickness uniformity. This is because the first silicon oxide film and the second silicon oxide film according to this embodiment are formed by performing one cycle multiple times, which includes supplying the HCDS gas, supplying the $NH_3$ gas and supplying the $O_2$ gas (Steps 1a to 6a, and Steps 1c to 6c). Also, the conventional CVD method refers to a method of forming a silicon oxide film (an HTO film) using a CVD method by simultaneously supplying DCS and $N_2O$ that are inorganic source materials.

Also, it was confirmed that the first silicon oxide film and the second silicon oxide film formed according to the film formation sequence of this embodiment had an extremely low concentration of impurities such as nitrogen or chlorine compared with the silicon oxide film (a CVD-SiO film) formed according to the conventional CVD method, and showed good quality, which indicates that an Si/0 ratio was extremely close to a stoichiometric composition of 0.5. This is because, in the formation sequence of the silicon oxide film according to this embodiment, the silicon nitride layer is converted into the silicon oxide layer using the oxide species containing $O_2^*$, which is obtained by activating the $O_2$ gas with the plasma (Steps 5a and 5c). When the oxide species containing $O_2^*$ is supplied to the silicon nitride layer, Si—N, Si—Cl, Si—H and Si—C bonds included in the silicon nitride layer may be generally separated due to energy of the $O_2^*$. Since energy used to form an Si—O bond is higher than binding energy of the Si—N, Si—Cl, Si—H and Si—C bonds, the Si—N, Si—Cl, Si—H and Si—C bonds in the silicon nitride layer may be separated by providing energy, which is required to form the Si—O bond, to the silicon nitride layer from the oxide species. N, H, Cl and C separated from the bonds with Si are removed from the film, and discharged in the form of $N_2$, $H_2$, $Cl_2$, HCl and $CO_2$. A bond number of Si remaining after being separated from the bonds with N, H, Cl and C is associated with 0 included in the oxide species. As a result, the first silicon oxide film and the second silicon oxide film may be the silicon oxide film having extremely good qualities. Therefore, the insulating film having an ONO stacked structure, which shows the extremely good qualities, may be obtained.

Also, the present invention is not limited to a case in which the first silicon oxide film and the second silicon oxide film according to this embodiment are formed using an inorganic silicon source material. Even when the first silicon oxide film and the second silicon oxide film were formed using an organic silicon source material, it was confirmed that the wafer had good in-plane film thickness uniformity, and a low concentration of impurities was present in the films. As a result, it was confirmed that the wafer 200 including the insulating film having an ONO stacked structure had good in-plane film thickness uniformity, and a low concentration of impurities was present in the film even when the first silicon oxide film and the second silicon oxide film were formed using the organic silicon source material.

In addition, when the silicon nitride film was formed according to the film formation sequence of this embodiment, it was confirmed that the wafer 200 had good in-plane film thickness uniformity, compared with a case in which the silicon nitride film was formed using the conventional CVD method. As result, it was confirmed that the wafer 200 including the insulating film having an ONO stacked structure had good in-plane film thickness uniformity. This is because the silicon nitride film according to this embodiment is formed by performing one cycle multiple times, which includes supplying the HCDS gas and supplying the NH$_3$ gas (Steps 1b to 4b). Also, the conventional CVD method refers to a method of forming a silicon nitride film using the CVD method by simultaneously supplying DCS and NH$_3$ that are inorganic source materials.

Additionally, it was confirmed that the silicon nitride film formed according to the film formation sequence of this embodiment had a low hydrogen concentration and showed extremely good qualities, compared with the silicon nitride film (a CVD-SiN film) formed using the conventional CVD method. This is because the silicon-containing layer is converted into the silicon nitride layer using the nitride species obtained by activating or pyrolyzing the NH$_3$ gas at a hot reduced pressure atmosphere according to the film formation sequence of the silicon nitride film according to this embodiment (Step 3b). Since the energy of the nitride species dissociates the Si—H bond as well as the N—H bond having a higher binding energy than the Si—H bond, H (hydrogen) may be removed from the silicon nitride layer. The removed H is exhausted in the form of H$_2$. Si and N separated from the bond with hydrogen are associated respectively with N and Si to form new Si—N bonds. As a result, the silicon nitride film may be used as a film having extremely good qualities. Accordingly, the insulating film having an ONO stacked structure, which shows the extremely good qualities, can be obtained.

Also, the present invention is not limited to a case in which the silicon nitride film according to this embodiment is formed using the inorganic silicon source material. Even when the silicon nitride film was formed using an organic silicon source material, it was confirmed the wafer had good in-plane film thickness uniformity, and a low concentration of impurities was present in the films. As a result, it was confirmed that, even when the silicon nitride film was formed using the organic silicon source material, the wafer 200 including the insulating film having an ONO stacked structure had good in-plane film thickness uniformity, and a low concentration of impurities was present in the film.

Furthermore, according to the film formation sequence of this embodiment, it was confirmed that the productivity in formation of the first silicon oxide film, the silicon nitride film and the second silicon oxide film, that is, the productivity in formation of the insulating film having an ONO stacked structure, could be highly improved. This is intended to continuously form the first silicon oxide film, the silicon nitride film and the second silicon oxide film in the same processing container (in situ), and also in the same temperature range according to the film formation sequence of this embodiment. Also, when the insulating film having an ONO stacked structure is formed using the conventional CVD method, a film formation temperature is not suitable for achieving an optimum film formation rate. Therefore, film formation of the silicon oxide film and the silicon nitride film in the same temperature range was difficult. In the film formation sequence of this embodiment, the productivity may be highly improved since temperature adjustment, that is, an increase in temperature of the substrate, may not necessarily be performed between the forming of the first silicon oxide film and the forming of the silicon nitride film and between the forming of the silicon nitride film and the forming of the second silicon oxide film. Also, the productivity may be highly improved since transfer of the wafer 200 between other devices or pressure regulation after the transfer of the wafer 200 may not necessarily be performed. In addition, the source gas having a high adsorbing property such as HCDS gas, that is, a source gas having high reactivity, and the oxide species obtained by activating the O$_2$ gas with the plasma may be used in formation of the silicon oxide film. Also, the source gas having a high adsorbing property such as HCDS gas, that is a source gas having high reactivity, and the nitride species obtained by activating or pyrolyzing the NH$_3$ gas may be used in formation of the silicon nitride film to perform film formation. As a result, a film formation rate of each film can be enhanced, and the productivity may be further improved. Also, when the silicon nitride film is formed on the silicon oxide film, a great deal of time is required until the silicon nitride film starts to be formed since an incubation time is generally required. However, the incubation time may be shortened or is not required when the source gas having a high adsorbing property such as HCDS gas, that is, a source gas having high reactivity, is used in this embodiment. Therefore, the productivity may be further improved.

<Second Embodiment of the Present Invention>

In the above-described first embodiment, the first oxide film and the second oxide film are formed by performing one cycle multiple times, which includes supplying the source gas, supplying the nitrogen-containing gas and supplying the oxygen-containing gas, but the present invention is not limited thereto.

For example, the forming of the first oxide film and/or the forming of second oxide film may be performed by performing one cycle multiple times, which includes performing one set multiple times, which includes supplying the source gas and supplying the nitriding gas, and supplying the oxygen-containing gas. Also, such a film formation sequence may be performed only in the forming of the first oxide film, performed only in the forming of the second oxide film, or also performed in both of the forming of the first oxide film and the forming of the second oxide film.

Figure 5:
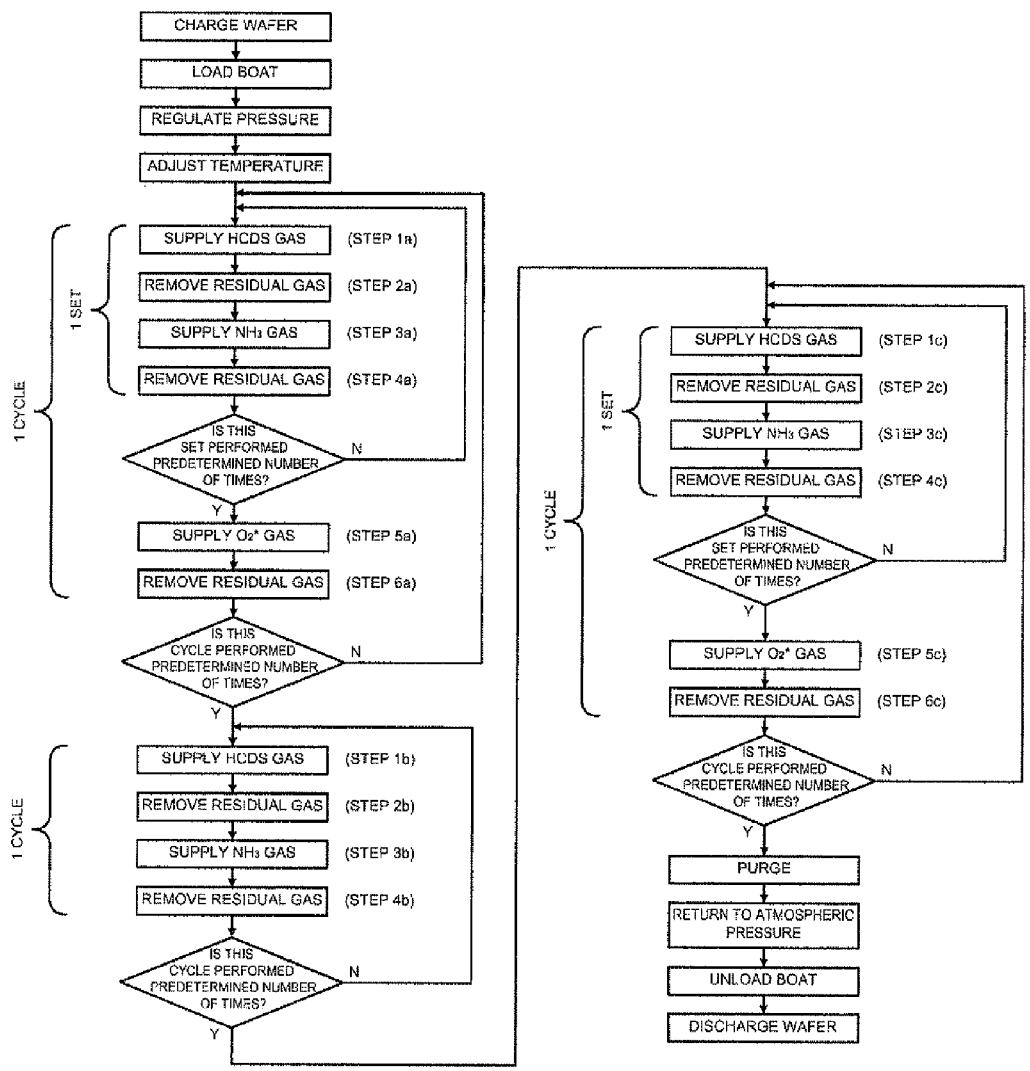
FIG. 5 is a diagram showing a film formation flow according to a second embodiment of the present invention.
Figure 10:
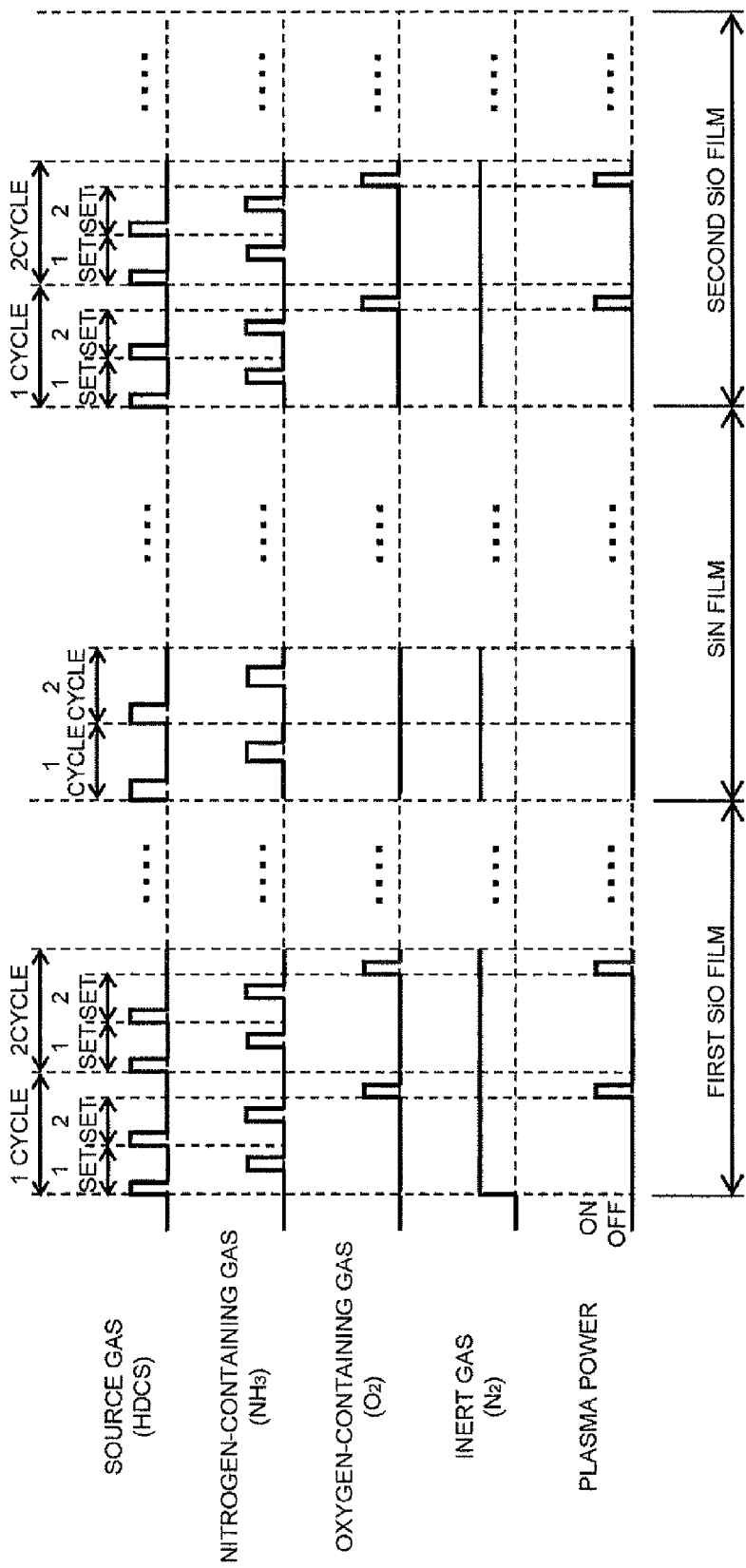
FIG. 10 is a diagram showing a gas supply timing according to the second embodiment of the present invention.

FIG. 5 is a diagram showing a film formation flow according to a second embodiment of the present invention. FIG. 10 is a diagram showing the gas supply timing according to the second embodiment of the present invention. The drawings show an example in which the above-described film formation sequence is performed in both of the forming of the first oxide film and the forming of the second oxide film. Also, FIG. 10 shows one example in which one set, which includes supplying the source gas and supplying the nitrogen-containing gas, is performed twice in the forming of the first oxide film and the forming of the second oxide film. Also, the second embodiment is different from the first embodiment in that the above-described set is repeatedly performed in the forming of the first oxide film and/or the forming of the second oxide film. Except for this, the second embodiment is identical to the first embodiment. Hereinafter, the forming of the first oxide film (a first silicon oxide film) and the forming of the second oxide film (a second silicon oxide film) will be described.

In the film formation sequence of the first silicon oxide film according to this embodiment, a silicon nitride layer having a predetermined thickness is formed on the wafer 200 by performing one set multiple times, which includes Steps 1a to 4a identical to Steps 1a to 4a of the first embodiment. Then, when the silicon nitride layer having a predetermined thickness is formed, the silicon nitride layer having a predetermined thickness is oxidized to be converted into the silicon oxide layer by performing the steps (of supplying the O$_2$ gas activated with the plasma and purging) identical to Steps 5a and 6a of the first embodiment. Then, the first silicon oxide film is formed by performing one cycle multiple times, which includes forming the silicon nitride layer having a predetermined thickness and converting the silicon nitride layer having a predetermined thickness into the silicon oxide layer.

Similarly, in the film formation sequence of the second silicon oxide film according to this embodiment, a silicon nitride layer having a predetermined thickness is also formed on the silicon nitride film by performing one set multiple times, which includes Steps 1c to 4c identical to Steps 1c to 4c of the first embodiment. Then, when the silicon nitride layer having a predetermined thickness is formed, the silicon nitride layer having a predetermined thickness is oxidized to be converted into the silicon oxide layer by performing the steps (of supplying the $O_2$ gas activated with the plasma and purging) identical to Steps 5a and 6a of the first embodiment. Then, the second silicon oxide film is formed by performing one cycle multiple times, which includes forming the silicon nitride layer having a predetermined thickness and converting the silicon nitride layer having a predetermined thickness into the silicon oxide layer.

In this embodiment, the same effects as in the above-described first embodiment may be achieved. Also, a thickness of each of the silicon oxide layers formed per one cycle in the forming of the first silicon oxide film and the forming of the second silicon oxide film may be increased by increasing a number of repetitions of each set composed of Steps 1a to 4a or Steps 1c to 4c, and a cycle rate (a thickness of the silicon oxide layer formed per unit cycle) may be improved.

<Third Embodiment of the Present Invention>

According to the above-described first embodiment, the first oxide film and the second oxide film are formed by performing one cycle multiple times, which includes supplying the source gas, supplying the nitrogen-containing gas and supplying the oxygen-containing gas, but the present invention is not limited thereto. For example, the forming of the first oxide film and/or the forming of the second oxide film may be performed without performing the supplying of the nitrogen-containing gas, and the supplying of the oxygen-containing gas may be performed by adding the hydrogen-containing gas in addition to the oxygen-containing gas.

That is, the forming of the first oxide film and/or the forming of the second oxide film may be performed by performing one cycle multiple times, which includes supplying the source gas and supplying the oxygen-containing gas and the hydrogen-containing gas. In the film formation sequence, the oxygen-containing gas and the hydrogen-containing gas are activated with heat rather than the plasma, and supplied, unlike the first embodiment. Also, such a film formation sequence may be performed only in the forming of the first oxide film, performed only in the forming the second oxide film, and also performed in both of the forming of the first oxide film and the forming of the second oxide film.

Figure 6:
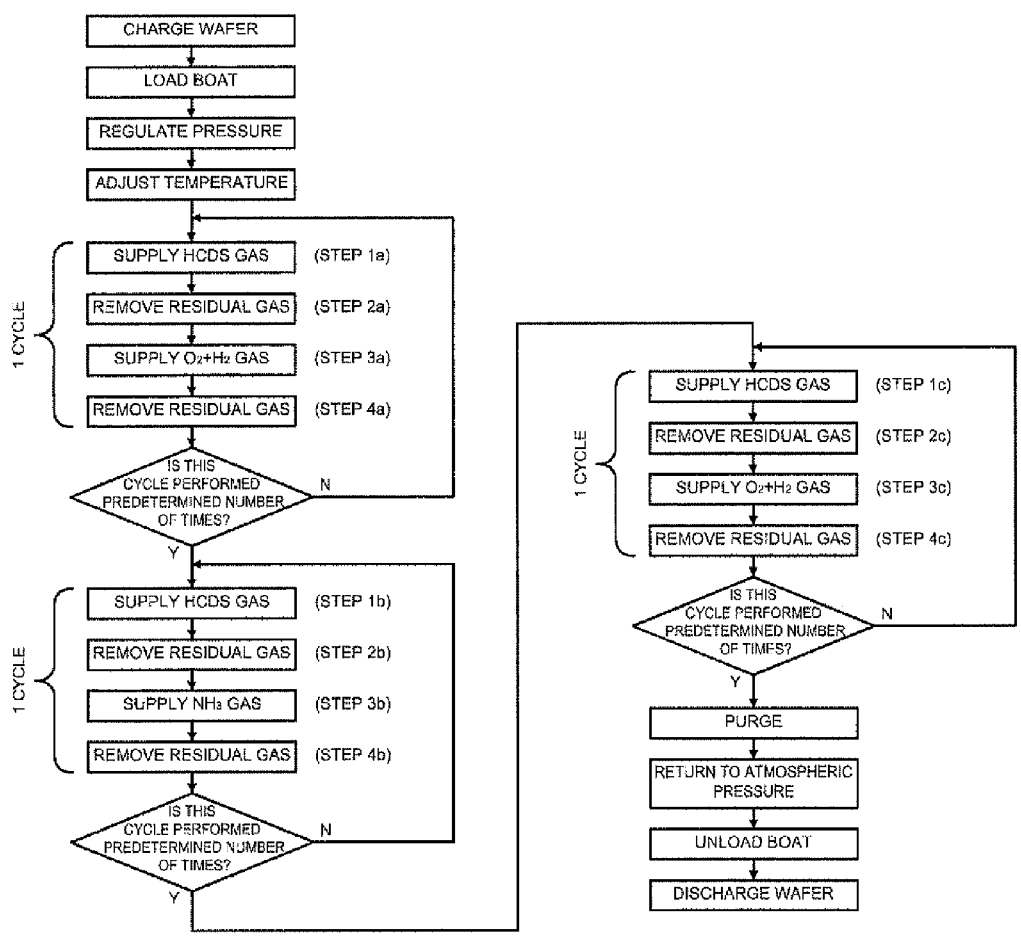
FIG. 6 is a diagram showing a film formation flow according to a third embodiment of the present invention.
Figure 11:
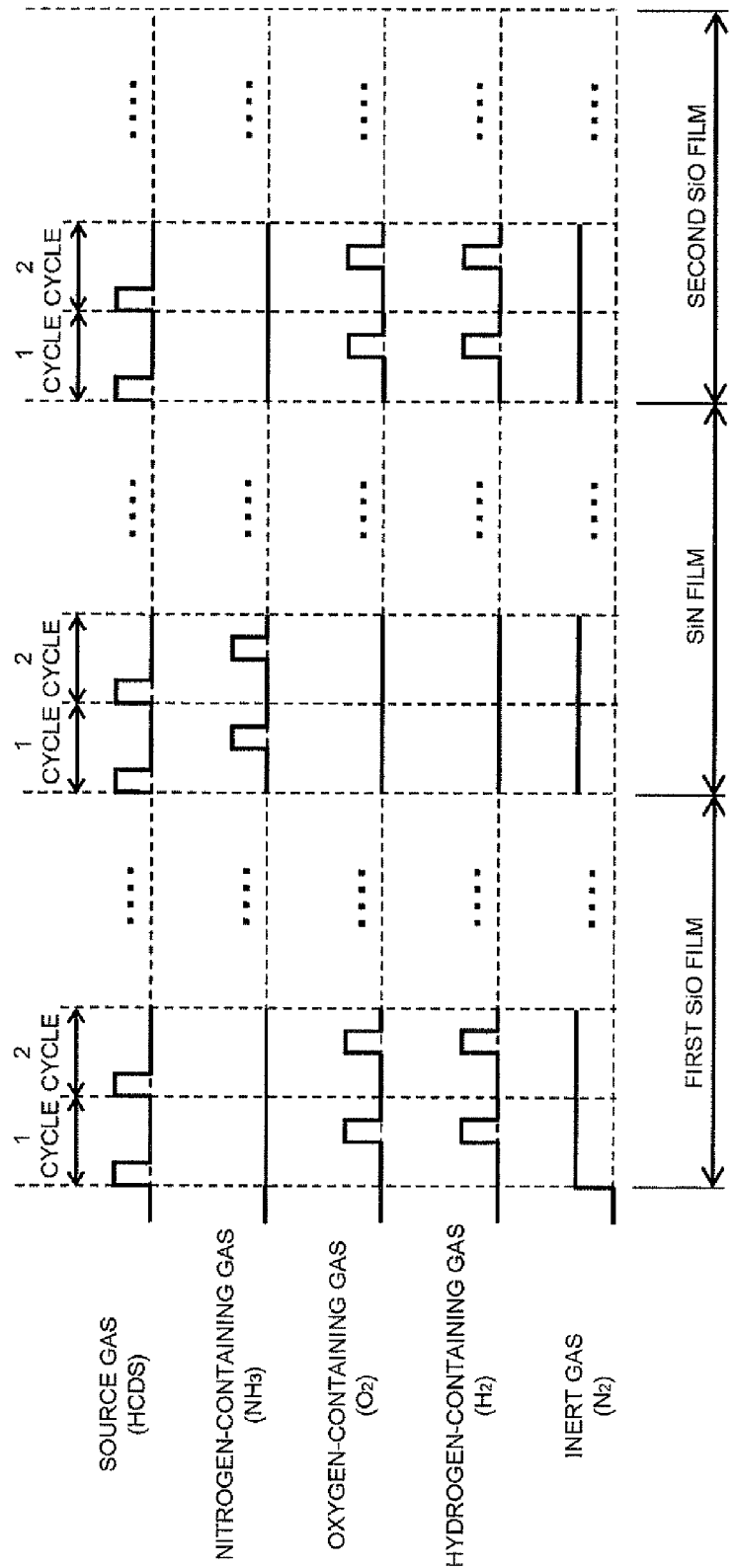
FIG. 11 is a diagram showing a gas supply timing according to the third embodiment of the present invention.

FIG. 6 is a diagram showing a film formation flow according to a third embodiment of the present invention. FIG. 11 is a diagram showing the gas supply timing according to the third embodiment of the present invention. The drawings shows an example in which the above-described film formation sequence is performed in both of the forming of the first oxide film and the forming of the second oxide film. Also, one example in which $H_2$ gas is used as the hydrogen-containing gas is shown. Also, the third embodiment is different from the first embodiment in that the supplying of the nitrogen-containing gas is omitted in the forming of the first oxide film and/or the forming of the second oxide film, and the hydrogen-containing gas is also supplied in addition to the oxygen-containing gas during the supplying of the oxygen-containing gas. Except for these, the third embodiment is identical to the first embodiment. Hereinafter, the forming of the first oxide film (a first silicon oxide film) and the forming of the second oxide film (a second silicon oxide film) will be described.

(Forming First Silicon Film)

As shown in FIGS. 6 and 11, in the film formation sequence of the first silicon oxide film according to this embodiment, first, a silicon-containing layer is formed on the wafer 200 by performing Steps 1a and 2a identical to Steps 1a and 2a of the first embodiment. Thereafter, the silicon-containing layer is directly oxidized to be converted (modified) into the silicon oxide layer by performing Steps 3a and 4a as will be described below, and a residual gas in the process chamber 201 is then removed. Then, a first silicon oxide film having a predetermined film thickness is formed on the wafer 200 by performing one cycle multiple times, which includes Steps 1a to 4a. Hereinafter, Steps 3a and 4a, which are different from those of the first embodiment, will be described.

[Step 3a]

After the residual gas in the process chamber 201 is removed, the valve 243c of the third gas supply pipe 232c is opened to allow the $O_2$ gas to flow through the third gas supply pipe 232c. The $O_2$ gas is allowed to flow through the third gas supply pipe 232c so that a flow rate of the $O_2$ gas is adjusted by means of the mass flow controller 241c. The $O_2$ gas whose flow rate is adjusted is supplied into the heated buffer chamber 237 whose inner part is in a reduced pressure state through the gas supply holes 248b of the second nozzle 233b via the second gas supply pipe 232b. In this case, the valve 243d of the fourth gas supply pipe 232d is simultaneously opened to allow the $H_2$ gas to flow through the fourth gas supply pipe 232d. The $H_2$ gas is allowed to flow through the fourth gas supply pipe 232d so that a flow rate of the $H_2$ gas is adjusted by means of the mass flow controller 241d. The $H_2$ gas whose flow rate is adjusted is supplied into the heated buffer chamber 237 whose inner part is in a reduced pressure state through the gas supply holes 248h of the second nozzle 233b via the second gas supply pipe 232b. Also, when the $H_2$ gas flows through the second gas supply pipe 232b, the $H_2$ gas is mixed with the $O_2$ gas in the second gas supply pipe 232b. That is, a mixed gas of $O_2$ gas and $H_2$ gas is supplied through the second nozzle 233b. The mixed gas of $O_2$ gas and $H_2$ gas supplied into the buffer chamber 237 is supplied into the heated process chamber 201 whose inner part is in a reduced pressure state through the gas supply holes 248c of the buffer chamber 237, and exhausted through the exhaust pipe 231 ($O_2$ gas+$H_2$ gas supplying).

In this case, the valve 243g of the third inert gas supply pipe 232g may be opened to supply the $N_2$ gas as the inert gas through the third inert gas supply pipe 232g. A flow rate of the $N_2$ gas is adjusted by means of the mass flow controller 241g so that the $N_2$ gas is supplied into the third gas supply pipe 232c. Also, the valve 243h of the fourth inert gas supply pipe 232h may be opened to supply the $N_2$ gas as the inert gas through the fourth inert gas supply pipe 232h. A flow rate of the $N_2$ gas is adjusted by means of the mass flow controller 241h so that the $N_2$ gas is supplied into the fourth gas supply pipe 232d. In this case, a mixed gas of $O_2$ gas, $H_2$ gas and $N_2$ gas is supplied through the second nozzle 233b. In addition to the $N_2$ gas, a rare gas such as Ar, He, Ne or Xe may also be used as the inert gas. In this case, to prevent invasion of the $O_2$ gas and $H_2$ gas into the first nozzle 233a or an upstream side of the second gas supply pipe 232b, the valves 243e and 243f are also opened to allow the $N_2$ gas to flow through the first inert gas supply pipe 232e and the second inert gas supply pipe 232f. The $N_2$ gas is supplied into the process chamber 201 via the first gas supply pipe 232a, the second gas supply pipe 232b, the first nozzle 233a, the second nozzle 233b and the buffer chamber 237, and exhausted through the exhaust pipe 231.

In this case, an opening degree of the APC valve 244 is properly adjusted to maintain a pressure in the process chamber 201 at a pressure less than atmospheric pressure, for example, at a pressure of 10 to 1,000 Pa. For example, a supply flow rate of the $O_2$ gas controlled by the mass flow controller 241c is set to a flow rate of 1,000 to 10,000 sccm (1 to 10 slm). A supply flow rate of the $H_2$ gas controlled by the mass flow controller 241d is, for example, set to a flow rate of 1,000 to 10,000 sccm (1 to 10 slm). Each supply flow rate of the $N_2$ gas controlled by the mass flow controllers 241g, 241h, 241e and 241f is, for example, set to a flow rate of 100 to 2,000 sccm (0.1 to 2 slm). Also, a time required to supply the $O_2$ gas and the $H_2$ gas to the wafer 200, that is, a gas supply time (irradiation time), is set to a time range of, for example, 1 to 120 seconds. A temperature of the heater 207 is set so that a temperature of the wafer 200 reaches a temperature range which is identical to that in the supply of the HCDS gas in Step 1a, that is, a temperature of 350 to 700° C. Also, it could be confirmed that an effect (as will be described below) of improving an oxidizing power by addition of the $H_2$ gas to the $O_2$ gas at a reduced pressure atmosphere could be obtained within this temperature range. In addition, it could be confirmed that an effect of improving an oxidizing power may not be obtained when the temperature of the wafer 200 is too low. In consideration of the throughput, a temperature of the heater 207 is preferably set so that the temperature in the process chamber 201 is retained within the same temperature range in Steps 1a to 3a, as described above. Similar to the first embodiment, the temperature of the heater 207 is more preferably set so that the temperature in the process chamber 201 is retained within this same temperature range throughout Steps 1a to 4a (as will be described below).

When the $O_2$ gas and the $H_2$ gas are supplied into the process chamber 201 under the above-described conditions, the $O_2$ gas and the $H_2$ gas are thermally activated with a non-plasma source at a hot reduced pressure atmosphere, and react with each other. As a result, a moisture ($H_2O$)-free oxide species containing oxygen such as atomic oxygen (O) is generated. In general, the silicon-containing layer formed on the wafer 200 in Step 1a is oxidized by the oxide species. Then, the silicon-containing layer is converted (modified) into the silicon oxide layer (an $SiO_2$ layer, hereinafter simply referred to as an "SiO layer") through the oxidation. When the oxidation is performed as described above, an oxidizing power may be highly improved compared with a case in which the $O_2$ gas is supplied alone. That is, when the $H_2$ gas is added to the $O_2$ gas in a reduced pressure atmosphere, the oxidizing power can be highly improved compared with a case in which the $O_2$ gas is supplied alone.

In this case, at least one of the $O_2$ gas and the $H_2$ gas may be activated with the plasma to flow, or both of the $O_2$ gas and the $H_2$ gas may be activated with the plasma. When the $O_2$ gas and/or the $H_2$ gas are/is activated with the plasma to flow, an oxide species including an active species having higher energy may be generated. When the oxidation is performed using the oxide species, an effect of improving device characteristics is also considered. For example, when both of the $O_2$ gas and the $H_2$ gas are activated with the plasma, a mixed gas of $O_2$ gas and $H_2$ gas supplied into the buffer chamber 237 is activated with the plasma by applying high-frequency electric power from the high-frequency power source 273 between the first rod-shaped electrode 269 and the second rod-shaped electrode 270 via the impedance matching unit 272. As a gas (an oxide species) containing $O_2^*$ (an active species of oxygen) or $H_2^*$ (an active species of hydrogen), the $O_2$ gas and the $H_2$ gas are then supplied into the process chamber 201 through the gas supply holes 248c, and exhausted through the exhaust pipe 231. In this case, the high-frequency electric power applied from the high-frequency power source 273 between the first rod-shaped electrode 269 and the second rod-shaped electrode 270 is, for example, set to have an electric power of 50 to 1,000 W. The other processing conditions are identical to the above-described processing conditions. Also, the $O_2$ gas and the $H_2$ gas are sufficiently activated with heat within the above-described temperature range to react with each other. As a result, a sufficient amount of the oxide species such as atomic oxygen (O) is generated. Thus, a sufficient oxidizing power can be achieved even when the $O_2$ gas and the $H_2$ gas are thermally activated with the non-plasma source. Also, since a soft reaction may also take place by activating the $O_2$ gas and the $H_2$ gas with heat and supplying the $O_2$ gas and the $H_2$ gas, the above-described oxidation may be softly performed.

In addition to the oxygen ($O_2$) gas, ozone ($O_3$) gas may be used as the oxygen-containing gas, that is, an oxidative gas. Also, an effect of adding of the hydrogen-containing gas as the nitric oxide (NO) gas or the nitrous oxide ($N_2O$) gas within the above-described temperature range was tested. As a result, it was confirmed that an effect of improving an oxidizing power could be obtained, compared with the supply of the NO gas or the $N_2O$ gas alone. That is, the nitrogen-free oxygen-containing gas (a gas that does not include nitrogen but includes oxygen) may be used as the oxygen-containing gas. In addition to the hydrogen ($H_2$) gas, deuterium ($D_2$) gas may be used as the hydrogen-containing gas, that is, a reductive gas. Also, when ammonia ($NH_3$) gas or methane ($CH_4$) gas is used, introduction of nitrogen (N) impurities or carbon (C) impurities into films may be problematic. That is, the other element-free hydrogen-containing gas (a gas that does not include the other element but includes hydrogen or deuterium) is preferably used as the hydrogen-containing gas. That is, at least one gas selected from the group consisting of $O_2$ gas and $O_3$ gas may be used as the oxygen-containing gas, and at least one gas selected from the group consisting of $H_2$ gas and $D_2$ gas may be used as the hydrogen-containing gas.

[Step 4a]

After the silicon-containing layer is converted into the silicon oxide layer, the valve 243c of the third gas supply pipe 232c is closed, and the supply of the $O_2$ gas is suspended. Also, the valve 243d of the fourth gas supply pipe 232d is closed, and the supply of the $H_2$ gas is suspended. In this case, the APC valve 244 of the exhaust pipe 231 is kept open and an inside of the process chamber 201 is vacuum-exhausted by means of the vacuum pump 246 so that an unreacted gas remaining in the process chamber 201 or the $O_2$ gas, the $H_2$ gas or reaction by-products after contributing to formation of the silicon oxide layer is eliminated from the process chamber 201. Also, the valves 243g, 243h, 243e and 243f are kept open to maintain the supply of the $N_2$ gas as the inert gas into the process chamber 201. The $N_2$ gas functions as the purge gas, and thus may further improve an effect of eliminating an unreacted gas remaining in the process chamber 201 or the $O_2$ gas, the $H_2$ gas or the reaction by-products after contributing to formation of the silicon oxide layer from the process chamber 201 (residual gas removal).

In this case, a gas remaining in the process chamber 201 may not be completely eliminated, or an inside of the process chamber 201 may not be completely purged. When a trace of the gas remains in the process chamber 201, adverse effects do not take place in Step 1 a which will be subsequently performed. In this case, an increase in flow rate of the $N_2$ gas supplied into the process chamber 201 is unnecessary. For example, when the N₂ gas is supplied at substantially the same amount as a capacity of the reaction tube 203 (a process chamber 201), purging may be performed to an extent to which no adverse effects take place in Step 1a. As described above, when the inside of the process chamber 201 is not completely purged, a purging time may be shortened, and throughput may be improved. Also, consumption of the N₂ gas can be minimized.

In this case, a temperature of the heater 207 is set so that the temperature of the wafer 200 reaches a temperature of 350 to 700° C., a range of which is identical to that in the supply of the O₂ gas and the H₂ gas. A supply flow rate of the N₂ gas serving as the purge gas supplied through each inert gas supply system is, for example, set to a flow rate of 100 to 2,000 sccm (0.1 to 2 slm). In addition to the N₂ gas, a rare gas such as Ar, He, Ne or Xe may be used as the purge gas.

A first silicon oxide film having a predetermined film thickness may be formed on the wafer 200 by performing one cycle multiple times, which includes Steps 1a to 4a as described above.

(Forming Second Silicon Film)

Similarly, a second silicon oxide film may also be formed by performing one cycle multiple times, which includes Steps 1c to 4c identical to Steps 1a to 4a according to this embodiment.

It was confirmed that the first silicon oxide film and the second silicon oxide film formed according to the film formation sequence of this embodiment had an extremely low concentration of impurities such as nitrogen, hydrogen or chlorine compared with the silicon oxide film (a CVD-SiO film) formed according to the conventional CVD method, and showed good quality, which indicates that an Si/O ratio was extremely close to a stoichiometric composition of 0.5. This is because, in the formation sequence of the silicon oxide film according to this embodiment, the O₂ gas and the H₂ gas react in a hot reduced pressure atmosphere to generate an oxide species containing atomic oxygen (O), and the silicon-containing layer is converted into the silicon oxide layer using the oxide species (Steps 3a and 3c). When the oxide species containing atomic oxygen (O) is supplied to the silicon-containing layer, Si—N, Si—Cl, Si—H and Si—C bonds included in the silicon-containing layer may be generally separated due to energy of the atomic oxygen. Since energy used to form an Si—O bond is higher than binding energy of the Si—N, Si—Cl, Si—H and Si—C bonds, the Si—N, Si—Cl, Si—H and Si—C bonds in the silicon-containing layer may be separated by providing energy, which is required to form the Si—O bond, to the silicon-containing layer from the oxide species. N, H, Cl and C separated from the bonds with Si are removed from the film, and discharged in the form of N₂, H₂, Cl₂, HCl and CO₂. A bond number of Si remaining after being separated from the bonds with N, H, Cl and C is associated with 0 included in the oxide species. In this case, the silicon oxide layer may also be densified. As a result, the first silicon oxide film and the second silicon oxide film may be the silicon oxide film having extremely good qualities. Therefore, the insulating film having an ONO stacked structure, which shows the extremely good qualities, may be obtained.

The same effects as described in the first embodiment may be achieved in this embodiment. Also, when the supplying of the nitrogen-containing gas is omitted in the forming of the first silicon oxide film and the forming of the second silicon oxide film, a time required per one cycle may be shortened compared with the first embodiment, and a film formation rate may be enhanced. Also, since the O₂ gas and the H₂ gas are activated with heat and supplied in the supplying of the oxygen-containing gas, a soft reaction may take place without causing plasma damage, thereby softly performing the oxidation as described above.

<Fourth Embodiment of the Present Invention>

In the third embodiment as described above, the first oxide film and the second oxide film are formed by performing one cycle multiple times, which includes supplying the source gas and supplying the oxygen-containing gas and the hydrogen-containing gas, but the present invention is not limited thereto.

For example, the forming of the first oxide film and/or the forming of the second oxide film may be performed by performing one cycle multiple times, which includes supplying the source gas and supplying the oxygen-containing gas and the hydrogen-containing gas, followed by performing the supplying of the oxygen-containing gas and the hydrogen-containing gas again (modifying process). Like the third embodiment, the oxygen-containing gas and the hydrogen-containing gas are activated with heat rather than the plasma and supplied even in this film formation sequence. Also, such a film formation sequence may be performed only in the forming of the first oxide film, performed only in the forming of the second oxide film, or performed in both of the forming of the first oxide film and the forming of the second oxide film.

Figure 7:
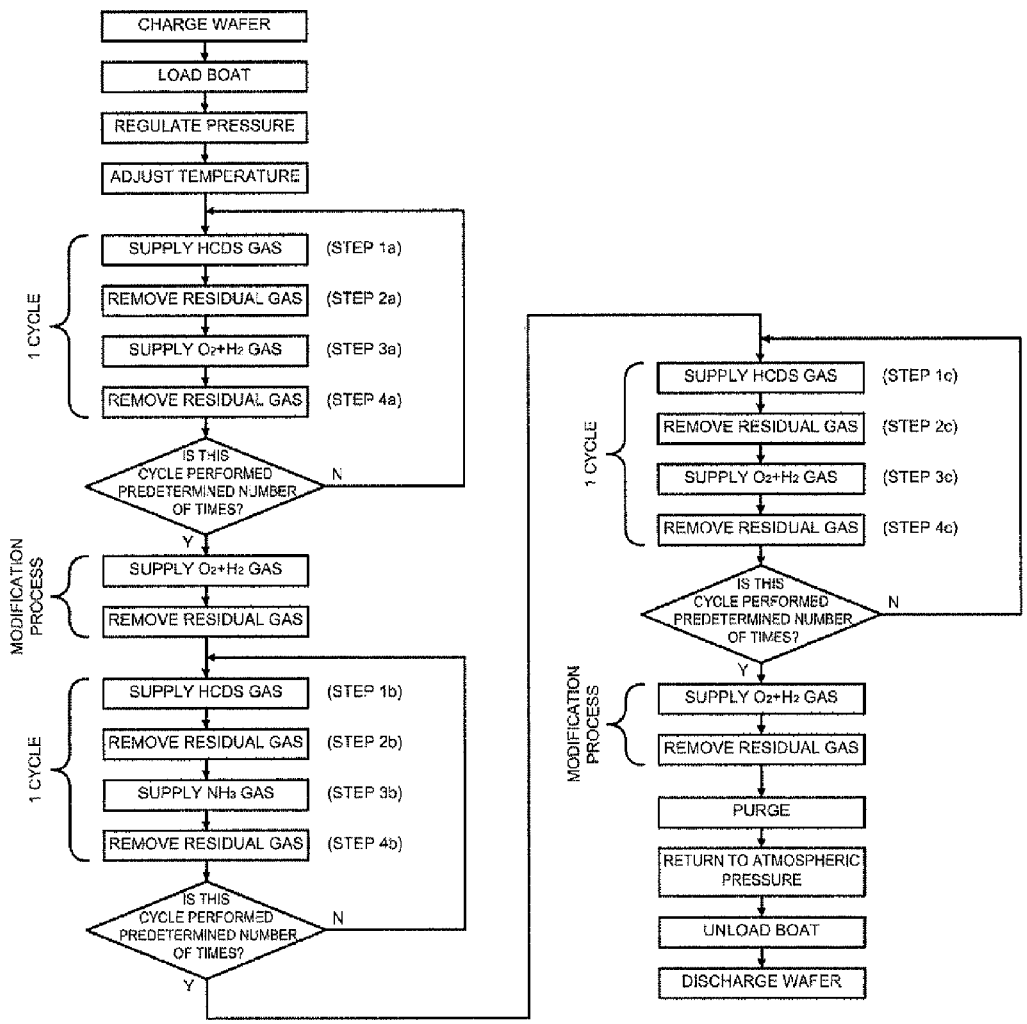
FIG. 7 is a diagram showing a film formation flow according to a fourth embodiment of the present invention.
Figure 12:
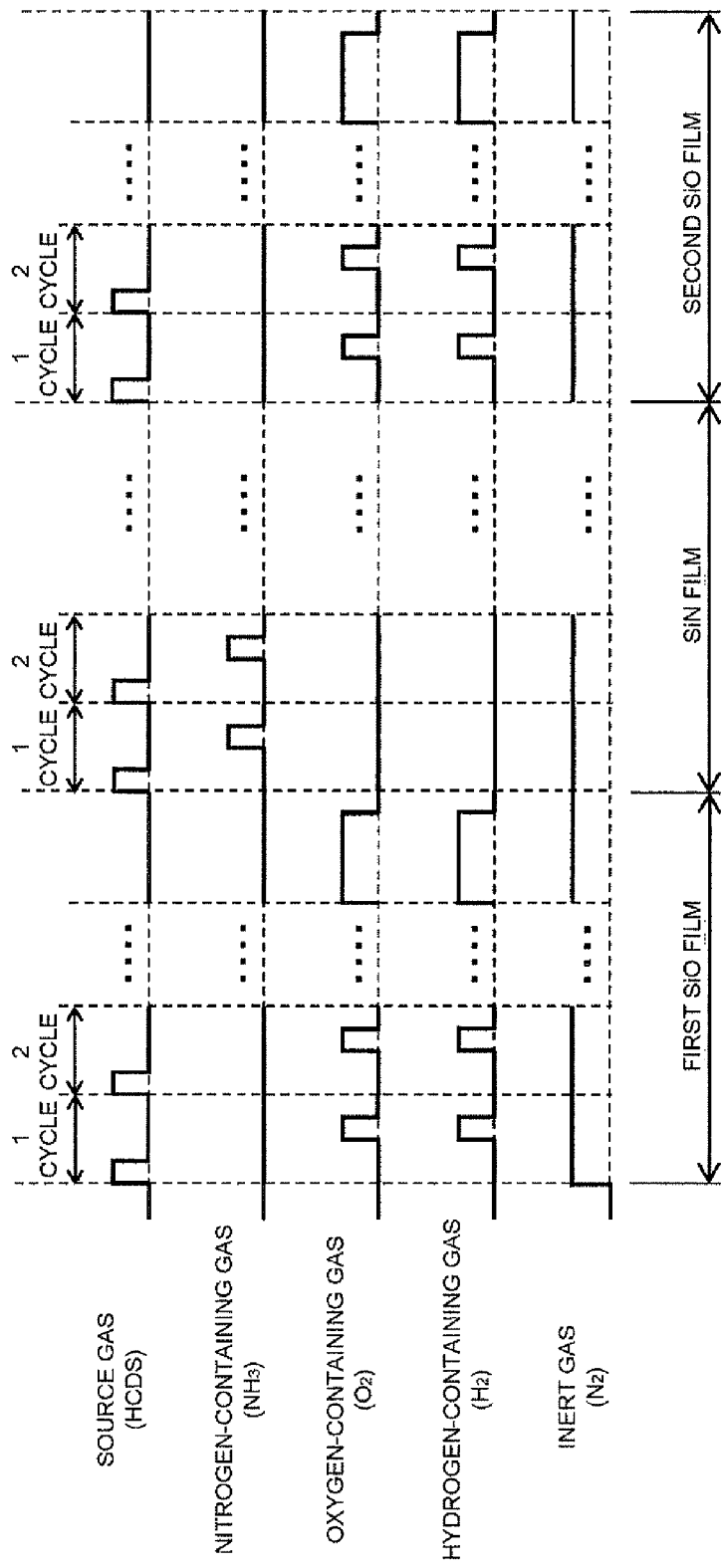
FIG. 12 is a diagram showing a gas supply timing according to the fourth embodiment of the present invention.

FIG. 7 is a diagram showing a film formation flow according to a fourth embodiment of the present invention. FIG. 12 is a diagram showing the gas supply timing according to the fourth embodiment of the present invention. The drawings show an example in which the above-described film formation sequence is performed in both of the forming of the first oxide film and the forming of the second oxide film. Also, one example in which the H₂ gas is used as the hydrogen-containing gas is shown. In addition, the fourth embodiment is different from the third embodiment in that one cycle, which includes supplying the source gas and supplying the oxygen-containing gas and the hydrogen-containing gas, is performed multiple times, and the supplying of the oxygen-containing gas and the hydrogen-containing gas is performed again as a modifying process in the forming of the first oxide film and/or the forming of the second oxide film. Except for these, the fourth embodiment is identical to the third embodiment. Hereinafter, the forming of the first oxide film (a first silicon oxide film) and the forming of the second oxide film (a second silicon oxide film) will be described.

In the film formation sequence of the first silicon oxide film according to this embodiment, a silicon oxide film having a predetermined film thickness is formed on the wafer 200 by performing one cycle multiple times, which includes Steps 1a to 4a identical to Steps 1a to 4a of the third embodiment. Thereafter, a modifying process in which the impurities are removed from the above-described silicon oxide film to improve film qualities is performed again by performing steps identical to Steps 3a and 4a of this embodiment. The first silicon oxide film is formed through a series of these processes.

Similarly, in the film formation sequence of the second silicon oxide film according to this embodiment, a silicon oxide film having a predetermined film thickness is also formed on the silicon nitride film by performing one cycle multiple times, which includes Steps 1c to 4c identical to Steps 1c to 4c of the third embodiment. Thereafter, a modifying process in which the impurities are removed from the above-described silicon oxide film to improve film qualities is performed again by performing steps identical to Steps 3c and 4c of the this embodiment. The second silicon oxide film is formed through a series of these processes.

Also, the processing conditions of the modifying process are substantially identical to those of Steps 3a, 4a, 3c and 4c. However, a temperature of the wafer 200 may be, for example, set to a temperature higher than those of Steps 3a, 4a, 3c and 4c so that the temperature of the wafer 200 reaches a temperature range of 350 to 1,200° C. In addition, a time required to supply the $O_2$ gas and the $H_2$ gas to the wafer 200, that is, a gas supply time (irradiation time), may be, for example, set to a time range of 1 to 600 minutes. FIG. 12 shows a pattern in which a time required to supply the $O_2$ gas and the $H_2$ gas to the wafer 200 in the modifying process is longer than a time required to supply the $O_2$ gas and the $H_2$ gas to the wafer 200 in Steps 3a and 3c.

It was confirmed that the first silicon oxide film and the second silicon oxide film formed according to the film formation sequence of the this embodiment had an extremely low concentration of impurities such as nitrogen, hydrogen or chlorine, compared with the silicon oxide film (a CVD-SiO film) formed using the conventional CVD method, and showed good quality, which indicates that an Si/O ratio was extremely close to a stoichiometric composition of 0.5. This is because, in the formation sequence of the silicon oxide film according to this embodiment, the $O_2$ gas and the $H_2$ gas react at a hot reduced pressure atmosphere to generate an oxide species containing atomic oxygen (O), and the silicon oxide film (an $SiO_2$ film) is modified using the oxide species (modifying process). When the oxide species containing atomic oxygen (O) is supplied to the silicon oxide film, Si—N, Si—Cl, Si—H and Si—C bonds included in the silicon oxide film may be generally separated due to energy of the atomic oxygen. Since energy used to form an Si—O bond is higher than binding energy of the Si—N, Si—Cl, Si—H and Si—C bonds, the Si—N, Si—Cl, Si—H and Si—C bonds in the silicon oxide film may be separated by providing energy, which is required to form the Si—O bond, to the silicon oxide film from the oxide species. N, H, Cl and C separated from the bonds with Si are removed from the film, and discharged in the form of $N_2$, $H_2$, $Cl_2$, HCl and $CO_2$. A bond number of Si remaining after being separated from the bonds with N, H, Cl and C is associated with O included in the oxide species. In this case, the silicon oxide film may also be densified. As a result, the first silicon oxide film and the second silicon oxide film may be the silicon oxide film having extremely good qualities. Therefore, the insulating film having an ONO stacked structure, which shows the extremely good qualities, may be obtained.

<Fifth Embodiment of the Present Invention>

In the first embodiment as described above, the first oxide film and the second oxide film are formed by performing one cycle multiple times, which includes supplying the source gas, supplying the nitrogen-containing gas and supplying the oxygen-containing gas, but the present invention is not limited thereto.

For example, the forming of the first oxide film and/or the forming of the second oxide film may be performed without performing the supplying of the source gas and the supplying of the nitrogen-containing gas. In the supplying of the oxygen-containing gas, the hydrogen-containing gas may be supplied in addition to the oxygen-containing gas, and the oxygen-containing gas and the hydrogen-containing gas may be continuously supplied. Also, such a film formation sequence may be performed only in the forming of the first oxide film, performed only in the forming of the second oxide film, or performed in both of the forming of the first oxide film and the forming of the second oxide film.

Figure 8:
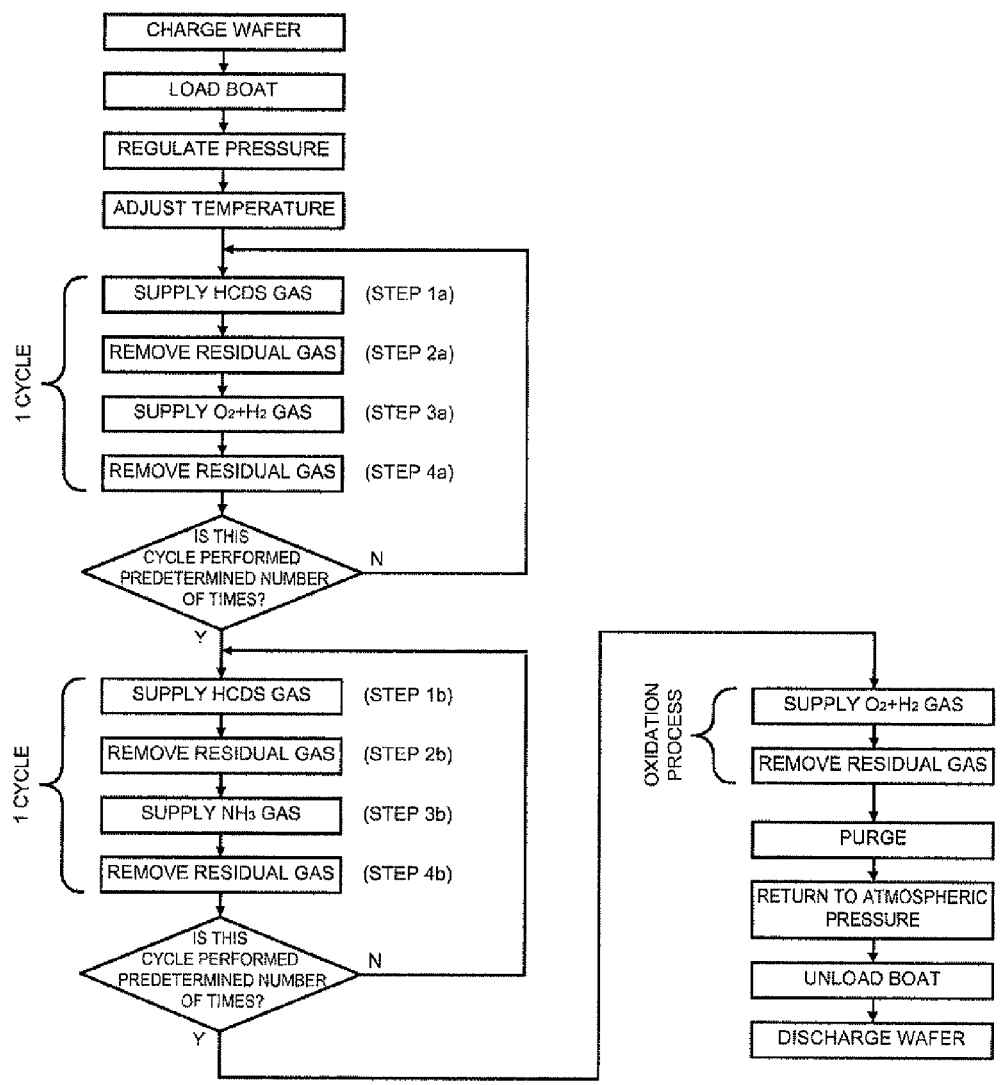
FIG. 8 is a diagram showing a film formation flow according to a fifth embodiment of the present invention.
Figure 13:
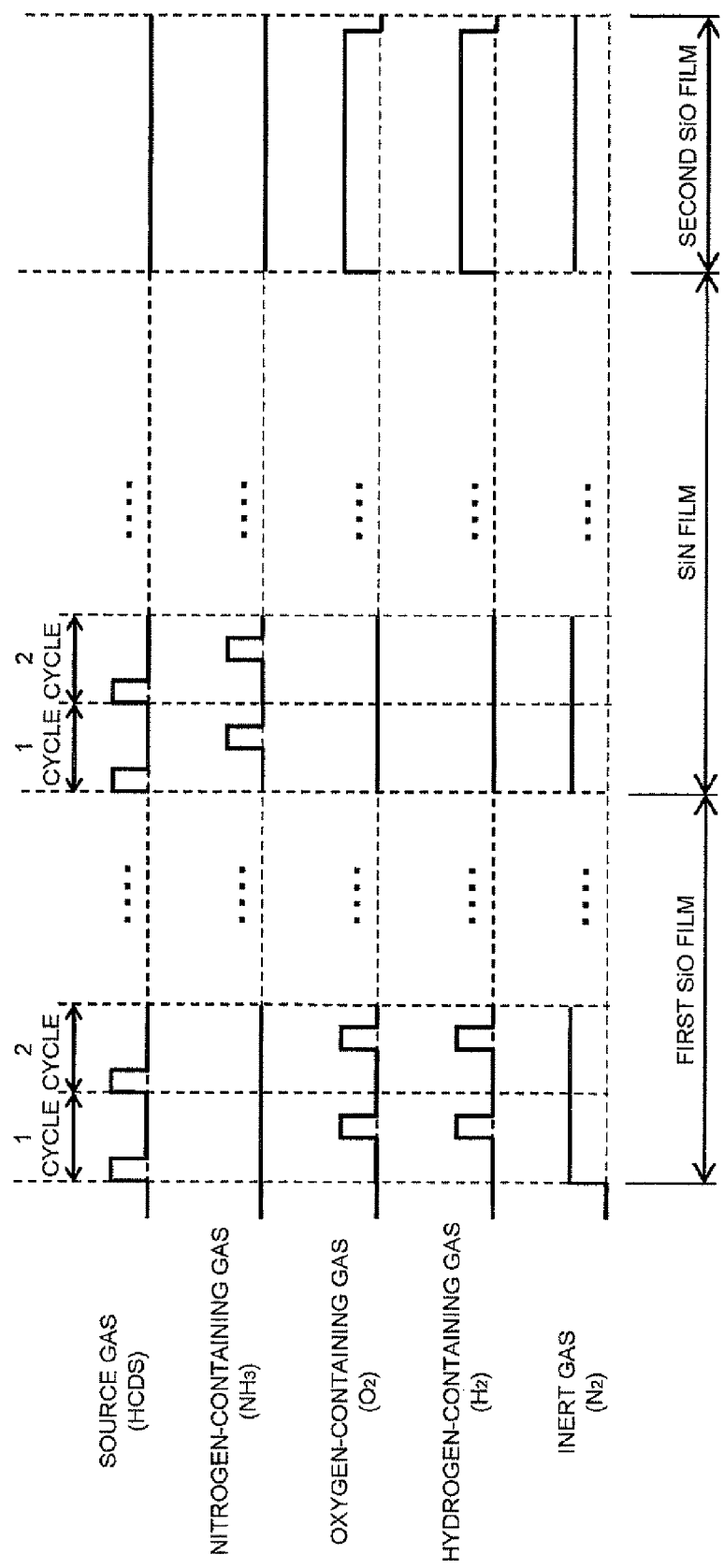
FIG. 13 is a diagram showing a gas supply timing according to the fifth embodiment of the present invention.

FIG. 8 is a diagram showing a film formation flow according to a fifth embodiment of the present invention. FIG. 13 is a diagram showing the gas supply timing according to the fifth embodiment of the present invention. The drawings show an example in which the above-described film formation sequence is performed only in the forming of the second silicon oxide film, and the first silicon oxide film is formed according to the film formation sequence described in the third embodiment. In addition, the fifth embodiment is different from the first embodiment in that the supplying of the source gas and the supplying of the nitrogen-containing gas are omitted in the forming of the first oxide film and/or the forming of the second oxide film, the hydrogen-containing gas is supplied in addition to the oxygen-containing gas during the supplying of the oxygen-containing gas, and the oxygen-containing gas and the hydrogen-containing gas are continuously supplied. Except for these, the fifth embodiment is identical to the first embodiment. Hereinafter, the forming of the first oxide film (a first silicon oxide film) and the forming of the second oxide film (a second silicon oxide film) will be described.

In the film formation sequence of the second silicon oxide film according to this embodiment, the first silicon oxide film is used as the underlying film to form a silicon nitride film. Then, the $O_2$ gas and the $H_2$ gas activated with heat are continuously supplied by performing steps identical to Steps 3a and 4a of the third embodiment without performing the supplying of the HCDS gas or the supplying of the $NH_3$ gas. Thereafter, the silicon nitride film serving as the underlying film is oxidized through purging to form the second silicon oxide film. That is, in this case, the second silicon oxide film is formed not by depositing the second silicon oxide film on the silicon nitride film as described in the embodiments, but by oxidizing a surface of the silicon nitride film. Therefore, in this case, the silicon nitride film formed on the first silicon oxide film is formed at a film thickness greater than an originally desired film thickness, and a thicker portion is oxidized to form the second silicon oxide film.

Also, when the first silicon oxide film is formed according to the above-described film formation sequence, that is, when the first silicon oxide film is formed by continuously supplying the $O_2$ gas and the $H_2$ gas activated with heated, followed by performing a purging process, the first silicon oxide film is formed by oxidizing the underlying silicon film formed in advance on the wafer 200. That is, in this case, the first silicon oxide film is formed not by depositing the first silicon oxide film on the silicon film formed on the wafer 200 as described in the embodiments, but by oxidizing a surface of the silicon film formed in advance on the wafer 200. Therefore, in this case, the silicon film formed on the wafer 200 is formed at a film thickness greater than an originally desired film thickness, and a thicker portion is oxidized to form the first silicon oxide film.

<Another Embodiment of the Present Invention>

Although the embodiments of the present invention have been described in detail as described above, the present invention is not limited to the above-described embodiments. Therefore, the embodiments of the present invention can be widely modified and changed without departing from the scope of the present invention.

For example, the first oxide film and second oxide film as described above may be formed using the same method, but the present invention is not limited thereto. Here, the first oxide film and second oxide film may be formed using another method.

For example, the first oxide film may be formed according to the film formation sequence of the first embodiment (see FIG. 4), and the second oxide film may formed according to the film formation sequence of the second embodiment (see FIG. 5). For example, the first oxide film may also be formed according to the film formation sequence of the third embodiment (see FIG. 6), and the second oxide film may be formed according to the film formation sequence of the fourth embodiment (see FIG. 7). Of course, the film formation sequence of the first oxide film and the second oxide film may be performed vice versa.

For example, the first oxide film may also be formed according to the film formation sequence of the first embodiment (see FIG. 4), and the second oxide film may be formed according to the film formation sequence of the fifth embodiment (see FIG. 8). For example, the first oxide film may also be formed according to the film formation sequence of the first embodiment (see FIG. 4), and the second oxide film may be formed according to the film formation sequence of the third embodiment (see FIG. 6). Of course, the film formation sequence of the first oxide film and the second oxide film may be performed vice versa.

That is, a combination of the film formation sequences disclosed in the above-described first to fifth embodiments may be properly used in the formation of the first oxide film and the formation of the second oxide film.

For example, the present invention is not limited to a case in which the above-described nitride film is formed by alternately performing the supplying of the source gas (HCDS gas) and the supplying of the nitriding gas (NH$_3$ gas). Thus, the supplying of the source gas and the supplying of the nitriding gas may be performed at the same time. As described in each of the embodiments, when the source gas having a high adsorbing property such as a chlorosilane-based source gas (for example, HCDS gas), that is, a source gas having high reactivity, is used as the source gas, the first oxide film, the nitride film and the second oxide film can be formed while retaining a temperature of the substrate at the same temperature range even when the source gas and the nitriding gas are supplied at the same time under the processing conditions described in each of the embodiments as described above. In this case, the film formation rate may be enhanced, compared with a case in which the source gas and the nitriding gas are alternately supplied, and the productivity in formation of the first oxide film, the nitride film and the second oxide film may be further improved.

In addition, one example in which the stacked film having a stacked structure of SiO/SiN/SiO (an ONO stacked structure) is formed has been described in the embodiments as described above, but the present invention is not limited thereto. For example, the present invention may preferably apply to a case in which a stacked film having a stacked structure of SiO/SiN/SiO/SiN/SiO (an ONONO stacked structure), a stacked film having a stacked structure of SiN/SiO/SiN (an NON stacked structure), a stacked film having a stacked structure of SiO/SiN (an ON stacked structure), or a stacked film having a stacked structure of SiN/SiO (an NO stacked structure) is formed.

The film formation sequence of this embodiment is not limited to a case in which the insulating film having an ONO stacked structure (or an ONONO, NON, ON or NO stacked structure) is formed on another film formed on the wafer (that is, a case in which a stacked structure is formed), but may preferably apply to a case in which the insulating film having an ONO stacked structure is formed on a trench structure formed on a surface of the wafer (that is, a case in which a trench structure is formed).

Also, when the oxide film is formed on the nitride film to form the stacked film having an ONO, ONONO, NON, ON or NO stacked structure, the nitride film serving as the underlying film in formation of the oxide film may be formed at a thickness greater than a film thickness of the nitride film, which is required to constitute the stacked film. When the oxide film is formed on the nitride film according to the film formation sequence of the embodiments as described above, a surface of the nitride film serving as the underlying film in the forming of the oxide film may be oxidized (consumed) so that the nitride film has a smaller film thickness than a film thickness of the nitride film required to constitute the stacked film. In particular, this tendency is remarkable when the oxide film is formed according to the film formation sequence of the third embodiment (see FIG. 6). In this case, a film thickness of the nitride film, which is oxidized (consumed) when the oxide film is formed on the nitride film, is measured in advance, and the nitride film is formed as thick as a film thickness of the oxidized nitride film when the nitride film is formed. As a result, a film thickness of the nitride film required for the stacked film can be secured.

Also, the forming of the oxide film as described above may further include adding nitrogen (N) into the oxide film. In this case, the forming of the oxide film may also include supplying the nitriding gas to the substrate in the processing container. For example, such processing conditions or the nitriding gas used may be the same processing conditions or nitriding gas as described in Step 3a in the film formation sequence of the first embodiment. Also, when a trace of nitrogen is added into the oxide film, this process may be performed under a non-plasma condition. In addition, the adding of nitrogen into the oxide film may be performed at the same time as the supplying of the oxidizing gas into the substrate in the processing container, or may be performed before/after supplying the oxidizing gas into the substrate.

For example, in the film formation sequence of the first embodiment (see FIG. 4), the adding of nitrogen into the oxide film may be performed at the same time as Step 5a, or may be performed before/after Step 5a. When the adding of nitrogen into the oxide film is performed before Step 5a, Step 3a may be performed as the adding of nitrogen into the oxide film. In this case, the silicon oxide film provided with nitrogen can be formed by increasing a nitridation amount of the silicon-containing layer as described in Step 3a or reducing an oxidation amount of the silicon nitride layer as described in Step 5a. In this case, Step 5a is preferably performed under the non-plasma condition.

For example, in the film formation sequence of the third embodiment (see FIG. 6), the adding of nitrogen into the oxide film may also be performed at the same time as Step 3a, or may be performed before/after Step 3a.

As described above, when the forming of the oxide film further includes adding nitrogen into the oxide film, an oxide film provided with nitrogen can also be formed.

Also, the forming of the nitride film as described above may further include adding oxygen (O) into the nitride film. In this case, the forming of the nitride film may also include supplying the oxidizing gas to the substrate in the processing container. For example, such processing conditions or the oxidizing gas used may be the same processing conditions or oxidizing gas as described in Step 5a in the film formation sequence of the first embodiment. However, when a trace of oxygen is added into the nitride film, this process may be performed under a non-plasma condition. In addition, the adding of oxygen into the oxide film may be performed at the same time as the supplying of the nitriding gas into the substrate in the processing container, or may be performed before/after supplying the nitriding gas into the substrate.

For example, in the film formation sequence of the first embodiment (see FIG. 4), the adding of oxygen into the nitride film may be performed at the same time as Step 3b, or performed before/after Step 3b. For example, in the film formation sequence of the third embodiment (see FIG. 6), the adding of oxygen into the nitride film may also be performed at the same time as Step 3b, or performed before/after Step 3b.

As described above, when the forming of the nitride film further includes adding oxygen into the nitride film, a nitride film provided with oxygen can also be formed.

Also, one example in which the stacked film having a stacked structure of SiO/SiN/SiO is formed has been described in the above-described embodiments, but the present invention is not limited thereto. For example, the present invention may preferably apply to a case in which the stacked film having a stacked structure of SiON/SiN/SiO is formed. In addition, the present invention may preferably apply to a case in which a stacked film having a stacked structure including at least one of an oxiynitride film (an SiON film), a nitride film (an SiN film) and an oxynitride film (an SiON film), such as a stacked film having a stacked structure of SiO/SiON/SiO, a stacked film having a stacked structure of SiO/SiN/SiON, and a stacked film having a stacked structure of SiON/SiN/SiON, is formed.

Figure 14:
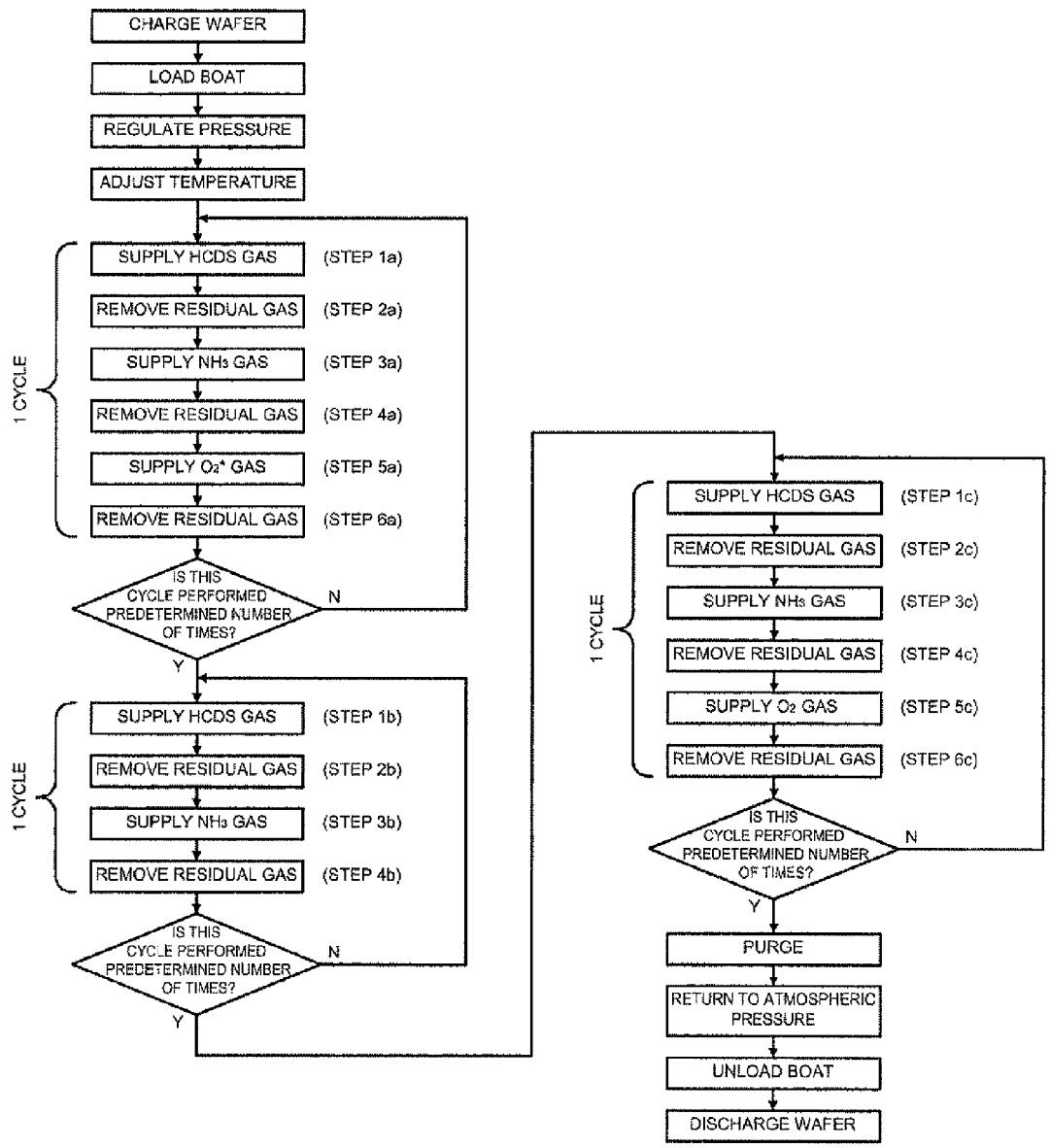
FIG. 14 is a diagram showing a film formation flow according to another embodiment of the present invention.
Figure 15:
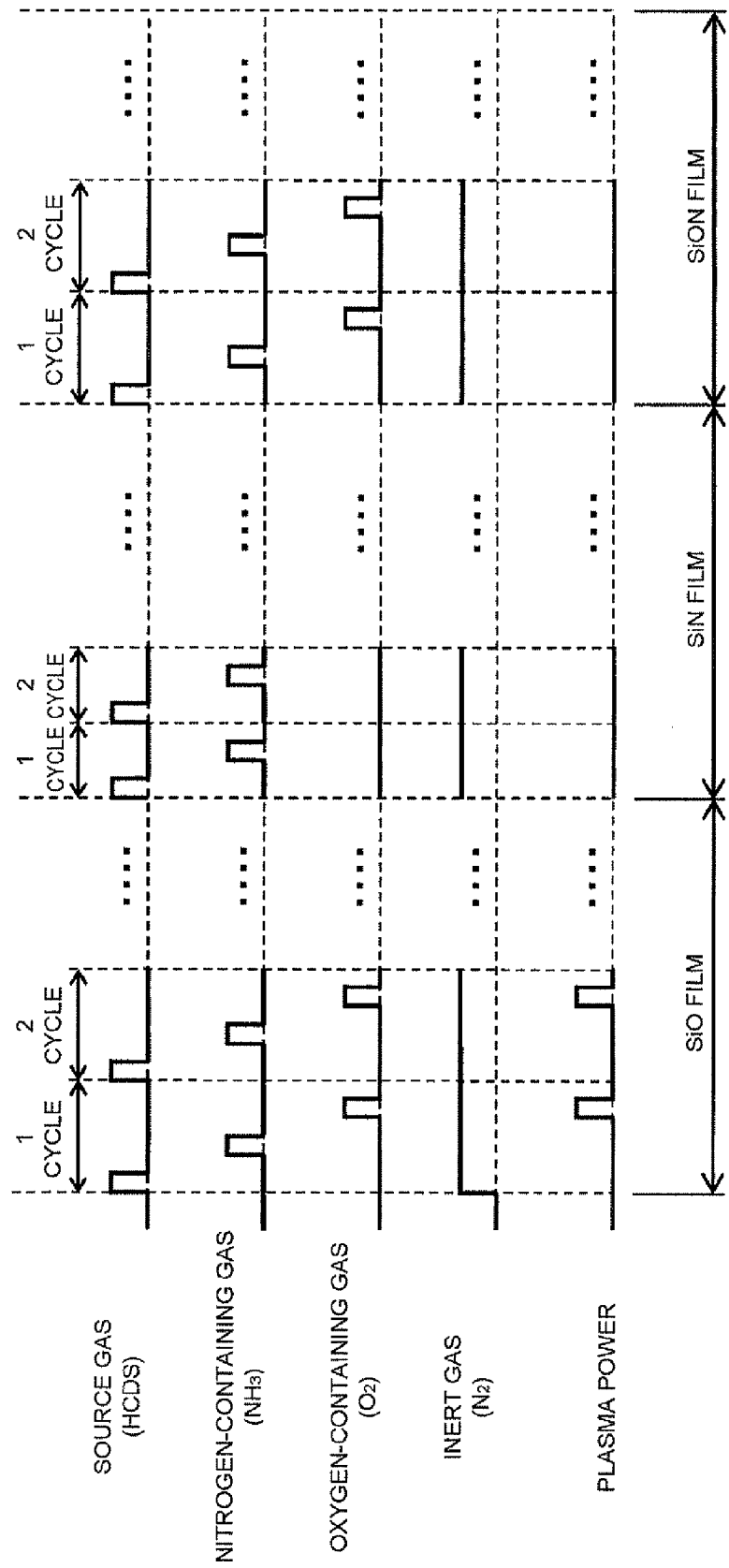
FIG. 15 is a diagram showing a gas supply timing according to another embodiment of the present invention.

For example, one example of the film formation sequence in which the insulating film having a stacked structure obtained by sequentially stacking the oxide film, the nitride film and the oxynitride film is formed on the substrate is shown in FIGS. 14 and 15. FIG. 14 is a diagram showing a film formation flow according to another embodiment of the present invention. FIG. 15 is a diagram showing the gas supply timing according to another embodiment of the present invention.

The forming of the oxide film or the forming of the nitride film shown in FIGS. 14 and 15 may be performed in the same manner as in the forming of the first silicon oxide film or the forming of the silicon nitride film in the above-described film formation sequence of the first embodiment (see FIG. 4). The forming of the oxynitride film shown in FIGS. 14 and 15 is performed by performing one cycle, which includes supplying the source gas to the substrate in the processing container, supplying the nitriding gas to the substrate and supplying the oxidizing gas to the substrate, a predetermined number of times. In this case, the processing conditions or gases used may be, for example, the same processing conditions and gases as described in the forming of the second silicon oxide film in the film formation sequence of the first embodiment (see FIG. 4). However, in Step 5c, the silicon nitride layer is necessarily oxidized in a non-plasma atmosphere, that is, under the conditions in which an oxidation reaction of the silicon nitride layer is unsaturated, so that the silicon nitride layer is converted (modified) into the silicon oxynitride layer (a SiON layer). That is, in Step 5c, the silicon nitride layer should be oxidized while inhibiting oxidation of the silicon nitride layer.

Also, when a source gas having a high adsorbing property such as a chlorosilane-based source gas (for example, HCDS gas), that is, a source gas having high reactivity, is used as the source gas as described in each of the above-described embodiments, the oxide film, the nitride film and the oxynitride film can be formed while retaining a temperature of the substrate in the same temperature range under the processing conditions described in each of the above-described embodiments.

Also, in the above-described embodiments, a case in which the stacked film of the silicon-based insulating film containing silicon as a semiconductor element is formed as a thin film has been described, but the present invention is not limited thereto. For example, the present invention may preferably apply to a case in which the stacked film of the metal-based thin film containing a metal element such as titanium (Ti), zirconium (Zr), hafnium (Hf), tantalum (Ta), aluminum (Al) or molybdenum (Mo) is formed.

For example, the present invention may also preferably apply to cases in which the stacked film having a stacked structure of a titanium oxide film (a TiO film) and a titanium nitride film (a TiN film) that are the titanium-based thin film is formed, the stacked film having a stacked structure of a zirconium oxide film (a ZrO film) and a zirconium nitride film (a ZrN film) that are the zirconium-based thin films is formed, the stacked film having a stacked structure of a hafnium oxide film (a HfO film) and a hafnium nitride film (a HfN film) that are the hafnium-based thin films is formed, the stacked film having a stacked structure of a tantalum oxide film (a TaO film) and a tantalum nitride film (a TaN film) that are the tantalum-based thin films is formed, the stacked film having a stacked structure of an aluminum oxide film (an AlO film) and an aluminum nitride film (an AlN film) that are the aluminum-based thin films, and the stacked film having a stacked structure of a molybdenum oxide film (a MoO film) and a molybdenum nitride film (a MoN film) that are the molybdenum-based thin films is formed.

In this case, a source material containing a metal element may be used as the source gas to perform the film formation according to the same film formation sequence as described in the above-described embodiments. Also, the same gases as described in the above-described embodiments may be used as the nitrogen-containing gas, the oxygen-containing gas and the hydrogen-containing gas. The same processing conditions as described in the above-described embodiments may also be used as the processing conditions.

For example, when the titanium-based thin film is formed, titanium tetrachloride ($TiCl_4$), tetrakis ethylmethylamino titanium ($Ti[N(C_2H_5)(CH_3)]_4$, abbreviated to TEMAT), tetrakis dimethylamino titanium ($Ti[N(CH_3)_2]_4$, abbreviated to TDMAT), or tetrakis diethylamino titanium ($Ti[N(C_2H_5)_2]_4$, abbreviated to TDEAT) may be used as the source material.

For example, when the zirconium-based thin film is formed, zirconium tetrachloride ($ZrCl_4$), tetrakis ethylmethylamino zirconium ($Zr[N(C_2H_5)(CH_3)]_4$, abbreviated to TEMAZ), tetrakis dimethylamino zirconium ($Zr[N(CH_3)_2]_4$, abbreviated to TDMAZ), or tetrakis diethylamino zirconium ($Zr[N(C_2H_5)_2]_4$, abbreviated to TDEAZ) may also be used as the source material.

For example, when the hafnium-based thin film is formed, hafnium tetrachloride ($HfCl_4$), tetrakis ethylmethylamino hafnium ($Hf[N(C_2H_5)(CH_3)]_4$, abbreviated to TEMAH), tetrakis dimethylamino hafnium ($Hf[N(CH_3)_2]_4$, abbreviated to TDMAH), or tetrakis diethylamino hafnium ($Hf[N(C_2H_5)_2]_4$, abbreviated to TDEAH) may also be used as the source material.

As described above, the present invention may apply to film formation of the stacked film including a metal-based thin film, as well as the stacked film including a silicon-based thin film. In this case, the present invention may have the same action effects as in the above-described embodiments. That is, the present invention may preferably apply to a case in which a thin film containing a predetermined element such as a semiconductor element or a metal element is formed.

Also, a case in which the thin film is formed using a batch-type substrate processing apparatus in which a plurality of substrates are processed one by one has been described in the above-described embodiments, but the present invention is not limited thereto. The present invention may preferably apply to a case in which a thin film is formed using a single sheet-type substrate processing apparatus in which one or several substrates are processed per one cycle.

Also, a combination of the above-described embodiments or modifications or applications thereof may be properly used herein.

Also, the present invention may be, for example, achieved using a modified process recipe of the conventional substrate processing apparatus. When the modified process recipe is used, the process recipe according to the present invention may be installed at a conventional substrate processing apparatus via an electric communication line or a non-transitory computer readable recording medium describing the process recipe. Also, a process recipe itself may be modified into the process recipe according to the present invention by handling an input/output device of the conventional substrate processing apparatus.

EXAMPLES

Example 1

In this Example, an insulating film having an ONO stacked structure, which was obtained by sequentially stacking a first silicon oxide film, a silicon nitride film and a second silicon oxide film on a silicon wafer, was formed on a silicon wafer in the same processing container (in situ), and also at the same temperature using the same manner as in the above-described first embodiment, and processing throughput (T.P.), that is, the number of wafers processed per hour, was measured. In Comparative Examples, an insulating film having an ONO stacked structure, which was obtained by sequentially stacking a silicon oxide film, a silicon nitride film and a silicon oxide film, was also formed on a silicon wafer in a different processing container at a different temperature using a conventional CVD method, and processing throughput (wfs/hr) was measured.

As a result, according to this Example, when it is assumed that a film thickness of each of the first silicon oxide film, the silicon nitride film and the second silicon oxide film was set to 5 nm, the processing times in each process were set as follows: heating for 60 minutes, forming of the first silicon oxide film for 11.5 minutes, forming of the silicon nitride film for 13.3 minutes, forming of the second silicon oxide film for 11.5 minutes, and cooling for 60 minutes. As a result, the throughput (T.P.) was as follows.

$$T.P.\text{(Example)} = 125[\text{wfs}]/((60 + 11.5 + 13.3 + 11.5 + 60)[\text{min}]/60[\text{min}])$$

$$= 48.0[\text{wfs/hr}]$$

In Comparative Examples, film thicknesses of all the silicon oxide film, the silicon nitride film and the silicon oxide film were set to 5 nm, which is identical to that of Example 1. As a result, since a film formation time of the silicon oxide film having a slow film formation rate, a temperature adjustment time between film formation processes, and a transfer time of the wafer were maintained constant, the throughput (T.P.) was as follows.

$$T.P.\text{(Comparative Example)} = 75[\text{wfs}]/6.6[\text{hr}]$$

$$= 11.2[\text{wfs/hr}]$$

Therefore, according to the film formation sequence used in this Example, it could be seen that the number of wafers processed per unit time was increased by 4 times, compared with the conventional CVD method used in Comparative Examples. That is, it could be seen that the productivity could be significantly improved when the insulating film having an ONO stacked structure was formed.

Example 2

In this Example, an ONO stacked structure was formed on a silicon wafer in the same processing container (in situ), and also at the same temperature in the same manner as in the above-described embodiment, and a cross-sectional TEM image of the ONO stacked structure was observed. As a result, it could be seen that the first silicon oxide film, the silicon nitride and the second silicon oxide film were sequentially stacked on the wafer. Also, it could be confirmed that all of the films were formed to have a uniform thickness, and the entire insulating film having the ONO stacked structure was formed to have a uniform thickness.

Example 3

In this Example, an insulating film having an ONO stacked structure was formed on a silicon wafer having a diameter of 300 mm in the same processing container (in situ), and also at the same temperature in the same manner as in the above-described embodiment, and an in-plane film thickness distribution of the insulating film was measured. Also, since three layers acts as one insulating film in the case of the insulating film having an ONO stacked structure, the in-plane film thickness distribution of the insulating film was measured on the assumption that the insulating film having an ONO stacked structure is a single film. Also, in Comparative Example 1, an HTO single film obtained by reaction of $SiH_4$ gas and $N_2O$ gas was formed on a silicon wafer having a diameter of 300 mm, and an in-plane film thickness distribution of the HTO single was measured. Also, in Comparative Example 2, a CVD-SiN single film obtained by reaction of DCS gas and $NH_3$ gas was formed on a silicon wafer having a diameter of 300 mm, and an in-plane film thickness distribution CVD-SiN single film was measured.

As a result, the insulating film having an ONO stacked structure according to this Example had an in-plane film thickness uniformity of approximately 0.5%, and the HTO single film and the CVD-SiN single film obtained in Comparative Examples 1 and 2 had an in-plane film thickness uniformity of approximately 2 to 4%. That is, it could be seen that the insulating film having an ONO stacked structure according to this Example had high in-plane film thickness uniformity, compared with the HTO single film of Comparative Example 1 or the CVD-SiN single film of Comparative Example 2. That is, it could be seen that, when the insulating film having an ONO stacked structure according to this Example was used as a layer of the semiconductor device, the in-plane uniformity in equivalent oxide film thickness (EOT) could be improved.

Example 4

In this Example, a stacked film having a stacked structure of SiON/SiN/SiO was formed on a silicon wafer in the same processing container (in situ), and also at the same temperature according to the film formation sequence shown in FIG. 14 or 15, and a cross-sectional TEM image of the stacked film was observed. As a result, it could be seen that the silicon oxide film, the silicon nitride film and the silicon oxynitride film were sequentially stacked on the wafer. Also, it could be confirmed that all of the films were formed to have a uniform thickness, and the entire insulating film having the stacked structure of SiON/SiN/SiO was formed to have a uniform thickness.

According to the present invention, a method of manufacturing a semiconductor device capable of improving the uniformity in film thickness of an insulating film having a structure in which oxide films and nitride films are stacked, and thus enhancing the productivity during film formation, a method of processing a substrate, a substrate processing apparatus and a non-transitory computer readable recording medium can be provided.

<Preferred Embodiments of the Present Invention>

Hereinafter, preferred embodiments of the present invention will be described as in the following notes.

(Supplementary Note 1)

According to one embodiment of the present invention, there is provided a method of manufacturing a semiconductor device including:

forming a stacked film having an oxide film and a nitride film stacked therein on a substrate in a processing container by alternately performing a first cycle and a second cycle a predetermined number of times, the first cycle including forming the oxide film by supplying a source gas, a nitriding gas and an oxidizing gas to the substrate in the processing container a predetermined number of times, and the second cycle including forming the nitride film by supplying the source gas and the nitriding gas to the substrate in the processing container a predetermined number of times, wherein the forming of the oxide film and the forming of the nitride film are consecutively performed while retaining a temperature of the substrate constant.

(Supplementary Note 2)

In the method of manufacturing a semiconductor device according to Supplementary Note 1, the first cycle may be performed multiple times.

(Supplementary Note 3)

In the method of manufacturing a semiconductor device according to Supplementary Note 1, the first cycle may include:

repeatedly performing a set of supplying the source gas and supplying the nitriding gas multiple times; and supplying the oxidizing gas, wherein the first cycle is performed multiple times.

(Supplementary Note 4)

In the method of manufacturing a semiconductor device according to Supplementary Note 1, the first cycle may be performed without performing the supplying of the nitriding gas, and the supplying of the oxidizing gas may include adding a reducing gas in addition to the oxidizing gas.

(Supplementary Note 5)

In the method of manufacturing a semiconductor device according to Supplementary Note 1, the first cycle may be performed without performing the supplying of the nitriding gas, and the supplying of the oxidizing gas may include adding a reducing gas in addition to the oxidizing gas. Here, the first cycle, which includes supplying the source gas and supplying the oxidizing gas and the reducing gas, may be performed multiple times.

(Supplementary Note 6)

In the method of manufacturing a semiconductor device according to Supplementary Note 1, the first cycle may be performed without performing the supplying of the nitriding gas, and the supplying of the oxidizing gas may include adding a reducing gas in addition to the oxidizing gas. Here, the first cycle, which includes supplying the source gas and supplying the oxidizing gas and the reducing gas, may be performed multiple times, and the supplying of the oxidizing gas and the reducing gas may be then performed again.

(Supplementary Note 7)

In the method of manufacturing a semiconductor device according to Supplementary Note 1, the first cycle may be performed without performing the supplying of the source gas and the supplying of the nitriding gas, and the supplying of the oxidizing gas may include adding a reducing gas in addition to the oxidizing gas. Here, the oxidizing gas and the reducing gas may be continuously supplied.

(Supplementary Note 8)

In the method of manufacturing a semiconductor device according to any one of Supplementary Notes 1 to 7, in forming the nitride film, the supplying of the source gas and the supplying of the nitriding gas may be performed simultaneously.

(Supplementary Note 9)

In the method of manufacturing a semiconductor device according to any one of Supplementary Notes 1 to 8, the fowling of the stacked film may include forming the oxide film on the nitride film, and the forming of the nitride film may be performed by forming the nitride film thicker than a desired film in the stacked film.

(Supplementary Note 10)

In the method of manufacturing a semiconductor device according to any one of Supplementary Notes 1 to 9, the forming of the oxide film may further include adding nitrogen into the oxide film.

(Supplementary Note 11)

In the method of manufacturing a semiconductor device according to any one of Supplementary Notes 1 to 10, the forming of the nitride film may further include adding oxygen into the nitride film.

(Supplementary Note 12)

The method of manufacturing a semiconductor device according to any one of Supplementary Notes 1 to 11 may further include forming the stacked film having the oxide film, the nitride film and a oxynitride film stacked therein on the substrate in the processing container by alternately performing the first cycle, the second cycle and a third cycle a predetermined number of times, the third cycle including forming the oxynitride film by supplying the source gas, the nitriding gas and the oxidizing gas to the substrate in the processing container a predetermined number of times. Here, the forming of the oxide film, the forming of the nitride film and the forming of the oxynitride film are consecutively performed while retaining a temperature of the substrate constant (Supplementary Note 13)

According to another embodiment of the present invention, there is provided a method of manufacturing a semiconductor device, the method including:

forming a first oxide film on a substrate in a processing container by performing a first cycle a predetermined number of times, the first cycle including supplying a source gas to the substrate, supplying a nitriding gas to the substrate and supplying an oxidizing gas to the substrate;

forming a nitride film on the first oxide film by performing a second cycle a predetermined number of times, the second cycle including supplying the source gas to the substrate in the processing container and supplying the nitriding gas to the substrate; and forming a second oxide film on the nitride film by performing a third cycle a predetermined number of times, the third cycle including supplying the source gas to the substrate in the processing container, supplying the nitriding gas to the substrate and supplying the oxidizing gas to the substrate. Here, the forming of the first oxide film, the forming of the nitride film and the forming of the second oxide film are consecutively performed while retaining a temperature of the substrate constant.

(Supplementary Note 14)

In the method of manufacturing a semiconductor device according to Supplementary Note 13, at least one of the first cycle and the third cycle may be performed multiple times.

(Supplementary Note 15)

In the method of manufacturing a semiconductor device according to Supplementary Note 13, at least one of the first cycle and the third cycle may include repeatedly performing a set of supplying the source gas and supplying the nitriding gas multiple times; and supplying the oxidizing gas, wherein at least one of the first cycle and the third cycle may be performed multiple times.

(Supplementary Note 16)

In the method of manufacturing a semiconductor device according to Supplementary Note 13, at least one of the forming of the first oxide film and the forming of the second oxide film may be performed without performing the supplying of the nitriding gas, and the supplying of the oxidizing gas may include adding a reducing gas in addition to the oxidizing gas.

(Supplementary Note 17)

In the method of manufacturing a semiconductor device according to Supplementary Note 13, at least one of the first cycle and the third cycle may be performed without performing the supplying of the nitriding gas, and the supplying of the oxidizing gas may include adding a reducing gas in addition to the oxidizing gas. Also, at least one of the first cycle and the third cycle includes supplying the source gas, and supplying the oxidizing gas and the reducing gas. Here, at least one of the first cycle and the third cycle may be performed multiple times.

(Supplementary Note 18)

In the method of manufacturing a semiconductor device according to Supplementary Note 13, at least one of the first cycle and the third cycle may be performed without performing the supplying of the nitriding gas, and the supplying of the oxidizing gas may include supplying a reducing gas in addition to the oxidizing gas. Also, at least one of the first cycle and the third cycle may includes supplying the source gas, and supplying the oxidizing gas and the reducing gas. And at least one of the forming of the first oxide film and the forming of the second oxide film may be performed by performing at least one of the first cycle and the third cycle multiple times, followed by supplying the oxidizing gas and the reducing gas again.

(Supplementary Note 19)

In the method of manufacturing a semiconductor device according to Supplementary Note 13, at least one of the first cycle and the third cycle may be performing without performing the supplying of the source gas and the supplying of the nitriding gas, and the supplying of the oxidizing gas may include supplying a reducing gas in addition to the oxidizing gas. Here, the oxidizing gas and the reducing gas may be continuously supplied.

(Supplementary Note 20)

According to still another embodiment of the present invention, there is provided a method of manufacturing a semiconductor device including:

Performing a cycle multiple times, the cycle including supplying a source gas to a substrate in a processing container and supplying a nitriding gas to the substrate in the processing container.

For a predetermined period of time for which the cycle is performed multiple times, a stacked film obtained by stacking an oxide film and a nitride film is formed on the substrate by supplying an oxidizing gas to the substrate in the processing container after the supplying of the nitriding gas and before the supplying of the source gas in the cycle within the predetermined period of time, and the supplying of the nitriding gas, the supplying of the source gas and the supplying of the oxidizing gas are consecutively performed while retaining a temperature of the substrate constant.

(Supplementary Note 21)

According to yet another embodiment of the present invention, there is provided a method of processing a substrate including:

forming a stacked film having an oxide film and a nitride film stacked therein on a substrate in a processing container by alternately performing a first cycle and a second cycle a predetermined number of times, the first cycle including forming the oxide film by supplying a source gas, a nitriding gas and an oxidizing gas to the substrate in the processing container a predetermined number of times, and the second cycle including forming the nitride film by supplying the source gas and the nitriding gas to the substrate in the processing container a predetermined number of times, wherein the forming of the oxide film and the forming of the nitride film are consecutively performed while retaining a temperature of the substrate constant.

(Supplementary Note 22)

According to yet another embodiment of the present invention, there is provided a substrate processing apparatus including:

a processing container configured to accommodate a substrate;

a heater configured to heat the substrate in the processing container;

a source gas supply system configured to supply a source gas to the substrate in the processing container;

a nitriding gas supply system configured to supply a nitriding gas to the substrate in the processing container;

an oxidizing gas supply system configured to supply an oxidizing gas to the substrate in the processing container; and a control unit configured to control the heater, the source gas supply system, the nitriding gas supply system and the oxidizing gas supply system so as to form a stacked film having an oxide film and a nitride film stacked therein on the substrate in the processing container by alternately performing a first cycle and a second cycle a predetermined number of times, the first cycle including forming the oxide film by supplying the source gas, the nitriding gas and the oxidizing gas to the substrate in the processing container a predetermined number of times, and the second cycle including forming the nitride film by supplying the source gas and the nitriding gas to the substrate in the processing container a predetermined number of times, wherein the forming of the oxide film and the forming of the nitride film are consecutively performed while retaining a temperature of the substrate constant.

(Supplementary Note 23)

According to yet another embodiment of the present invention, there is provided a program causing a computer to perform a process, the process including:

forming a stacked film having an oxide film and a nitride film stacked therein on a substrate in a processing container by alternately performing a first cycle and a second cycle a predetermined number of times, the first cycle including forming the oxide film by supplying a source gas, a nitriding gas and an oxidizing gas to the substrate in the processing container a predetermined number of times, and the second cycle including forming the nitride film by supplying the source gas and the nitriding gas to the substrate in the processing container a predetermined number of times, wherein the forming of the oxide film and the forming of the nitride film are consecutively performed while retaining a temperature of the substrate constant.

(Supplementary Note 24)

According to yet another embodiment of the present invention, there is provided a non-transitory computer-readable recording medium storing a program causing a computer to perform a process, the process including:

forming a stacked film having an oxide film and a nitride film stacked therein on a substrate in a processing container by alternately performing a first cycle and a second cycle a predetermined number of times, the first cycle including forming the oxide film on the substrate by supplying a source gas, a nitriding gas and an oxidizing gas to the substrate in the processing container a predetermined number of times, and the second cycle including forming the nitride film by supplying the source gas and the nitriding gas a predetermined number of times, wherein the forming of the oxide film and the forming of the nitride film are consecutively performed while retaining a temperature of the substrate constant.

What is claimed is:

1. A method of manufacturing a semiconductor device, comprising:
    forming a stacked film having an oxide film and a nitride film stacked therein on a substrate in a processing container by alternately performing the following steps a predetermined number of times:
    (a) forming the oxide film by performing a first cycle a predetermined number of times, the first cycle comprising non-simultaneously supplying a source gas, a nitriding gas and an oxidizing gas to the substrate in the processing container, and
    (b) forming the nitride film by performing a second cycle a predetermined number of times, the second cycle comprising supplying the source gas and the nitriding gas to the substrate in the processing container,
    wherein (a) and (b) are consecutively performed while keeping a temperature of the substrate at a constant value, and
    wherein (a) further comprises adding nitrogen into the oxide film.

2. The method according to claim 1, wherein the first cycle is performed multiple times.

3. The method according to claim 1, wherein the first cycle comprises:
    repeatedly performing a set of supplying the source gas and supplying the nitriding gas multiple times; and
    supplying the oxidizing gas,
    wherein the first cycle is performed multiple times.

4. The method according to claim 1, wherein during (b), the steps of supplying of the source gas and the supplying of the nitriding gas are performed simultaneously.

5. The method according to claim 1, wherein the forming of the stacked film comprises forming the oxide film on the nitride film, and
    the forming of the nitride film is performed by forming the nitride film thicker than a desired nitride film in the stacked film.

6. A method of manufacturing a semiconductor device, comprising:
    forming a stacked film having an oxide film and a nitride film stacked therein on a substrate in a processing container by alternately performing the following steps a predetermined number of times:
    (a) forming the oxide film by performing a first cycle a predetermined number of times, the first cycle comprising non-simultaneously supplying a source gas, and an oxidizing gas and a reducing gas to the substrate in the processing container, and
    (b) forming the nitride film by performing a second cycle a predetermined number of times, the second cycle comprising supplying the source gas and a nitriding gas to the substrate in the processing container,
    wherein (a) and (b) are consecutively performed while keeping a temperature of the substrate at a constant value, and
    wherein (a) further comprises adding nitrogen into the oxide film.

7. The method according to claim 6, wherein the first cycle is performed multiple times.

8. The method according to claim 6, wherein (a) further comprises supplying the oxidizing gas and the reducing gas after performing the first cycle multiple times.

9. The method according to claim 6, wherein the reducing gas includes a nitrogen-free, hydrogen-containing gas.

10. The method according to claim 6, wherein the reducing gas includes at least one gas selected from a group consisting of a hydrogen gas and deuterium gas.

11. A method of manufacturing a semiconductor device, comprising:
    forming a stacked film having an oxide film and a nitride film stacked therein on a substrate in a processing container by alternately performing the following steps a predetermined number of times:
    (a) forming the oxide film by performing a first cycle a predetermined number of times, the first cycle comprising non-simultaneously supplying a source gas, a nitriding gas and an oxidizing gas to the substrate in the processing container, and
    (b) forming the nitride film by performing a second cycle a predetermined number of times, the second cycle comprising supplying the source gas and the nitriding gas to the substrate in the processing container,
    wherein (a) and (b) are consecutively performed while keeping a temperature of the substrate at a constant value, and
    wherein (b) further comprises adding oxygen into the nitride film.

12. A substrate processing apparatus comprising:
    a processing container configured to accommodate a substrate;
    a heater configured to heat the substrate in the processing container;
    a source gas supply system configured to supply a source gas to the substrate in the processing container;
    a nitriding gas supply system configured to supply a nitriding gas to the substrate in the processing container;
    an oxidizing gas supply system configured to supply an oxidizing gas to the substrate in the processing container;
    a reducing gas supply system configured to supply a reducing gas into the substrate in the processing container; and
    a control unit configured to control the heater, the source gas supply system, the nitriding gas supply system the oxidizing gas supply system and the reducing gas supply system so as to form a stacked film having an oxide film and a nitride film stacked therein on the substrate in the processing container by alternately performing the following steps a predetermined number of times: (a) forming the oxide film by performing a first cycle a predetermined number of times, the first cycle comprising non-simultaneously supplying the source gas, the nitriding gas, the oxidizing gas and the reducing gas to the substrate in the processing container, and (b) forming the nitride film by performing a second cycle a predetermined number of times, the second cycle comprising supplying the source gas and the nitriding gas to the substrate in the processing container, wherein (a) and (b) are consecutively performed while retaining a temperature of the substrate at a constant value, and wherein (a) further comprises adding nitrogen into the oxide film or (b) further comprises adding oxygen into the nitride film.

13. A non-transitory computer-readable recording medium storing a program causing a computer to perform a process, the process comprising:

forming a stacked film having an oxide film and a nitride film stacked therein on a substrate in a processing container by alternately performing the following steps a predetermined number of times:

(a) forming the oxide film by performing a first cycle a predetermined number of times, the first cycle comprising non-simultaneously supplying a source gas, an oxidizing gas and a reducing gas to the substrate in the processing container, and (b) forming the nitride film by performing a second cycle a predetermined number of times, the second cycle comprising supplying the source gas and a nitriding gas to the substrate in the processing container, wherein (a) and (b) are consecutively performed while keeping a temperature of the substrate at a constant value, and wherein (a) further comprises adding nitrogen into the oxide film or (b) further comprises adding oxygen into the nitride film.

14. A method of manufacturing a semiconductor device, comprising:

forming a stacked film having an oxide film and a nitride film stacked therein on a substrate in a processing container by alternately performing the following steps a predetermined number of times:

(a) forming the oxide film by performing a first cycle a predetermined number of times, the first cycle comprising non-simultaneously supplying a source gas, and an oxidizing gas and a reducing gas to the substrate in the processing container, and (b) forming the nitride film by performing a second cycle a predetermined number of times, the second cycle comprising supplying the source gas and a nitriding gas to the substrate in the processing container, wherein (a) and (b) are consecutively performed while keeping a temperature of the substrate at a constant value, and wherein (b) further comprises adding oxygen into the nitride film.

* * * * *